(12) United States Patent
Gaouda et al.

(10) Patent No.: US 10,345,358 B2
(45) Date of Patent: Jul. 9, 2019

(54) SMART FAULT DETECTION DEVICE TO ANTICIPATE IMPENDING FAULTS IN POWER TRANSFORMERS

(71) Applicants: QATAR UNIVERSITY, Doha (QA); University of Waterloo, Waterloo (CA); United Arab Emirates University, Al-Ain (AE)

(72) Inventors: Ahmed Gaouda, Al-Ain (AE); Khaled Bashir Shaban, Doha (QA); Magdy Salama, Waterloo (CA); Atef Abdrabou, Al-Ain (AE); Ramadan Elshatshat, Waterloo (CA); Mutaz Mohamed Elhassan Elsawi Khairalla, Al-Ain (AE); Ahmed Abdrabou, Al-Ain (AE)

(73) Assignees: QATAR UNIVERSITY, Doha (QA); UNIVERSITY OF WATERLOO, Waterloo (CA); UNITED ARAB EMIRATES UNIVERSITY, Ai Ain (AE)

( * ) Notice: Subject to any disclaimer, the term of this patent is extended or adjusted under 35 U.S.C. 154(b) by 299 days.

(21) Appl. No.: 15/137,721

(22) Filed: Apr. 25, 2016

(65) Prior Publication Data
US 2017/0307676 A1    Oct. 26, 2017

(51) Int. Cl.
| G01R 31/00 | (2006.01) |
| G01R 31/02 | (2006.01) |
| G01R 31/08 | (2006.01) |

(52) U.S. Cl.
CPC ......... G01R 31/027 (2013.01); G01R 31/025 (2013.01); G01R 31/086 (2013.01);
(Continued)

(58) Field of Classification Search
None
See application file for complete search history.

(56) References Cited

U.S. PATENT DOCUMENTS

| 3,887,867 A * | 6/1975 | Safer ............... G01R 31/025 324/509 |
| 6,154,036 A * | 11/2000 | Baldwin ............ G01R 31/086 324/509 |

(Continued)

OTHER PUBLICATIONS

Andersson et al., "Substation Automation based on IEC 61850 with new process-close Technologies," 2003 IEEE Bologna Power Tech Conference Proceedings, vol. 2, Jun. 23-26, 2003.

Primary Examiner — Evren Seven
(74) Attorney, Agent, or Firm — Squire Patton Boggs (US) LLP

(57) ABSTRACT

Certain embodiments may generally relate to a smart fault detection device for power grids, and a method of fault detection for power grids. A method may include receiving raw data samples of currents in grounding conductors and line conductors. The method may also include processing the raw data samples under at least one of a plurality of system operating modes. The method may also include monitoring normal operation and anticipating an impending fault while operating under at least one of the system operating modes. The method may further include extracting fault information based on the monitoring. The method may also include reporting the fault information to a supervisory control and data acquisition system human-machine interface. The method may further include anticipating faults based on an analysis of the raw data samples.

19 Claims, 15 Drawing Sheets

(52) U.S. Cl.
CPC ........... *G01R 31/088* (2013.01); *Y02E 60/728* (2013.01); *Y04S 10/265* (2013.01); *Y04S 10/522* (2013.01)

(56) References Cited

U.S. PATENT DOCUMENTS

| | | | |
|---|---|---|---|
| 6,718,271 B1 * | 4/2004 | Tobin | G01R 31/024 324/521 |
| 6,774,639 B1 * | 8/2004 | Unsworth | G01R 31/1227 324/535 |
| 7,848,897 B2 | 12/2010 | Williams, Jr. | |
| 8,560,255 B2 | 10/2013 | Elwarry et al. | |
| 9,276,396 B2 * | 3/2016 | Dadash Zadeh | H02H 3/063 |
| 9,310,416 B2 * | 4/2016 | Al-Ghannam | G01R 31/08 |
| 2007/0206644 A1 | 9/2007 | Bertsch et al. | |
| 2008/0077336 A1 | 3/2008 | Fernandes | |
| 2012/0004867 A1 * | 1/2012 | Mousavi | G01R 31/3274 702/58 |
| 2012/0086459 A1 * | 4/2012 | Kim | G01R 29/18 324/522 |
| 2014/0232415 A1 | 8/2014 | Ohtomo et al. | |
| 2016/0274166 A1 * | 9/2016 | Seff | G01R 31/025 |

\* cited by examiner

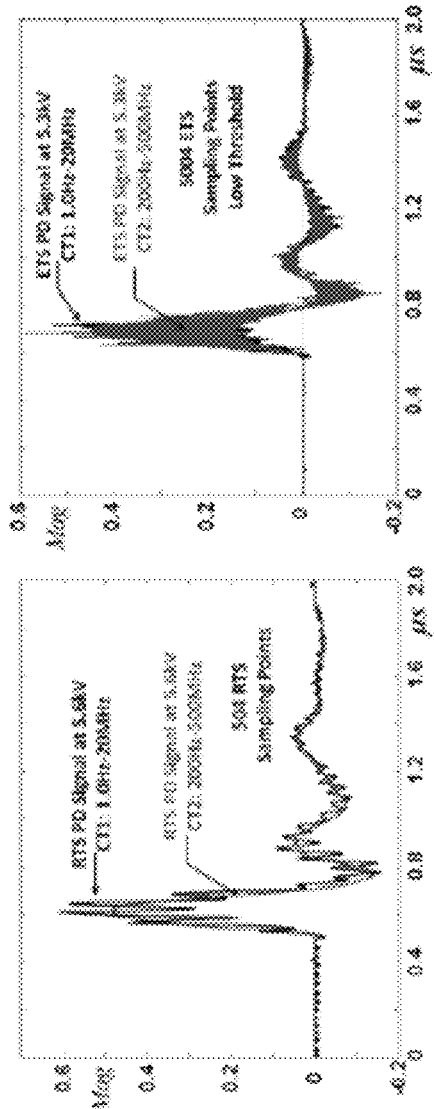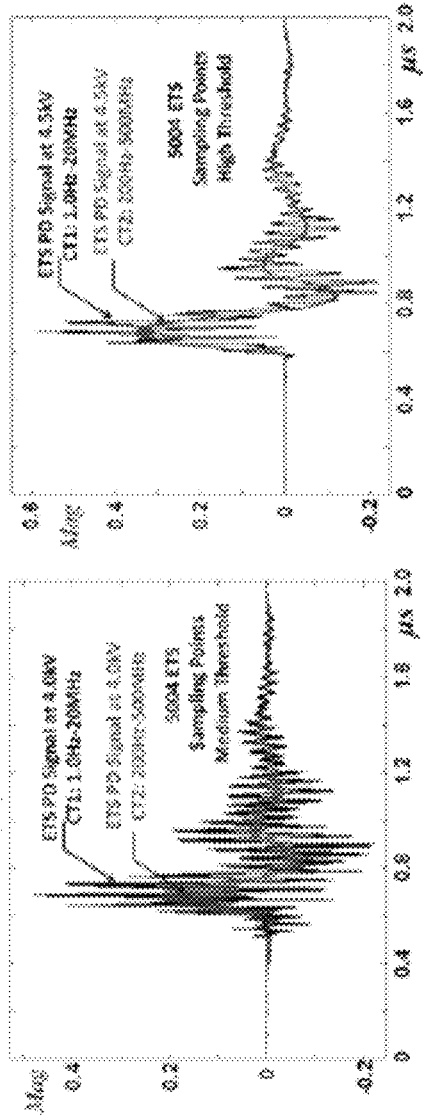
Figure 4(a)
Figure 4(b)
Figure 4(c)
Figure 4(d)

SMART FAULT DETECTION DEVICE TO ANTICIPATE IMPENDING FAULTS IN POWER TRANSFORMERS

FIELD OF THE INVENTION

The present invention generally relates to fault detection. More specifically, the present invention relates to a smart fault detection device for power grids, and a method of fault detection for power grids.

BACKGROUND OF THE INVENTION

The global smart grid technology market is growing due to increasing demand for grid optimization and efficiency. Growth in electricity generation by independent power producers (IPPs) and nonutility generators (NUGs), as well greater electrical output using renewable resources, result in increased product sales, since these operations need to be appropriately equipped to deliver power to the electric grid. Furthermore, efforts to modernize the electric grid and to improve efficiency and reliability, support market advances via the incorporation of "smart" technologies that provide a number of advantages, but also cost considerably more than conventional equipment.

Smart meters are generally digital meters that send energy usage information via radio frequency electromagnetic radiation to a utility company. They have evolved from traditional analog meters to digital electronic devices that are capable of tracking and recording a customer's energy usage, as well as communicate with the energy supplier. Smart meters help reduce meter reading costs, inefficiencies in billing, disconnection and re-connection costs to the corporations, utilities, as well as consumers.

The smart grid vision is generally targeting fully automated power grids where reliable and efficient operation of every system element, node, and customers are utilized in order to optimize the energy value chain. Achieving this vision in distribution system imposes self-healing abilities to autonomously take corrective actions, operate the system to the best possible state and perform basic functions without violating any constraints. Self-healing systems may tend to perform continuous monitoring and analysis during three different modes of system operation, which may include: under normal operation; during impending faults; and during system faults.

During impending faults, self-healing systems may aim to prevent failures instead of mitigating them. They may be capable of detecting and localizing impending faults and anticipating their influence to trigger a full-scale event. However, faults may sometimes be unavoidable. Hence, self-healing systems quickly isolate faulty sections, to avoid spread over of disruption, and enable rapid restoration and dynamic updating of protection settings based on actual system configuration.

The success of implementing self-healing algorithms in distribution systems may be dependent on complete integration and interaction of different functions within distribution management systems. Different data sources may be interfaced to share different data models and serve different functions. Some challenges when developing such systems may include, for instance, the need to significantly increase real-time and non-real-time measurements, adopting modularity to implement system functions, and the ability of managing high data sets. Moreover, anticipating impending faults in primary substations and other scattered distribution system equipment may be challenging. Early stages of failure modes of some equipment, such as switchgears, transformers, voltage regulators, and capacitor banks are developed over time with blurred symptoms that may not be noticed until devices fail. In addition, cracked transformer bushings, degradation in line insulators, bad terminal connections, and thermal stresses are usually the major causes to hot spots, partial discharge (PD), sparks, or electric arcs.

PD and arcs are common symptoms of impending faults, however, their transient and intermittent nature disable protection relays to detect until flashover with devastating impact is developed. Unless assets drop offline, distribution systems operators are often unaware of the developing conditions leading to equipment failures. Furthermore, future distribution systems are subject to great uncertainty due to penetration of distributed generation and electric vehicles as well as consumer response to real-time pricing and rewarding policies. Anticipating an impending fault in such stressed systems, which operate using complex protection, is a difficult task.

There is a need therefore, for a system and/or method that is capable of monitoring and diagnosing equipment health. There is a further need for a system and/or method that is capable of continuously monitoring distributed energy system operation, detect and localize impending faults, and isolates faulty sections of system equipment.

SUMMARY OF THE INVENTION

Embodiments of the present invention overcome the above-mentioned and other drawbacks by providing a smart fault detection device for power grids, and methods of fault detection for power grids.

One embodiment is directed to a method for impending fault detection in primary substation transformers, and faults in feeders connecting primary substations with distribution substation in ring systems. The method may include receiving raw data samples of currents in grounding conductors and line conductors. The method may also include processing the raw data samples under at least one of a plurality of system operating modes. The method may further include monitoring normal operation. The method may also include anticipating an impending fault or detecting faults while operating under at least one of the system operating modes. The method may also include extracting fault information based on the monitoring. The method may further include reporting the fault information to a supervisory control and data acquisition system human-machine interface. The method may also include anticipating faults based on an analysis of the raw data samples.

In an embodiment, the method may further include processing the raw data samples multiple times with a wavelet-based windowing technique. According to an embodiment, the system operating modes may include a real-time sampling mode, and an estimated time sampling mode. The method may further include selecting the real-time sampling mode or the estimated time sampling mode based on connected measuring instructions and expected details to be extracted from a processed signal. The method may also include detecting and localizing a plurality of adjacent wavelet coefficients at a plurality of resolution levels. The method may further include defining a maximum number of adjacent wavelet coefficients detected and localized at each resolution level. The method may also include utilizing the maximum coefficients detected and localized at each resolution level to reconstruct the fault information for diagnostic and analysis.

Another embodiment is directed to an apparatus for impending fault detection in primary substation transformers. The apparatus may include at least one processor, and at least one memory including computer program code, wherein the at least one memory and the computer program code are configured, with the at least one processor, to cause the apparatus at least to receive raw data samples of currents in grounding conductors and line conductors. The apparatus may also include at least one processor, and at least one memory including computer program code, wherein the at least one memory and the computer program code are configured to process the raw data samples under at least one of a plurality of system operating modes, monitor normal operation, anticipate an impending fault or detect faults while operating under at least one of the system operating modes, extract fault information based on the monitoring, report the fault information to a supervisory control and data acquisition system human-machine interface, and anticipate faults based on an analysis of the raw data samples.

According to an embodiment, the at least one memory and the computer program code may be configured, with the at least one processor, to cause the apparatus at least to process the raw data samples multiple times with a wavelet-based windowing technique. In an embodiment, the system operating modes may include a real-time sampling mode and an estimated time sampling mode based on the connected measuring instruments and expected details to be extracted. According to an embodiment, the at least one memory and the computer program code may also be configured, with the at least one processor, to cause the apparatus at least to detect and localize a plurality of adjacent wavelet coefficients at a plurality of resolution levels. According to an embodiment, the at least one memory and the computer program code may further be configured, with the at least one processor, to cause the apparatus at least to define a maximum number of adjacent wavelet coefficients detected and localized at each resolution level. In an embodiment, the at least one memory and the computer program code may be configured, with the at least one processor, to cause the apparatus at least to utilize the maximum coefficients detected and localized at each resolution level to reconstruct the fault information for diagnostic and analysis.

Another embodiment may be directed to a computer program embodied on a non-transitory computer program, that when executed by a processor, causes the processor to receive raw data samples of currents in grounding conductors and line conductors, process the raw data samples collected under at least one of two operating modes, monitor normal operation, anticipate an impending fault while operating under at least one of the system operating modes, extract fault information based on the monitoring, report the fault information to a supervisory control and data acquisition system human-machine interface, and anticipate faults based on an analysis of the raw data samples.

In an embodiment, the computer program, when executed by the processor, may further cause the processor to process the raw data samples multiple times with a wavelet-based windowing technique. According to an embodiment, the data collection operating modes may include a real-time sampling mode and an estimated time sampling mode. In an embodiment, the computer program, when executed by the processor, may further cause the processor to detect and localizing a plurality of adjacent wavelet coefficients at a plurality of resolution levels. In an embodiment, the computer program, when executed by the processor, may also cause the processor to define a maximum number of adjacent wavelet coefficients detected and localized at each resolution level. According to an embodiment, the computer program, when executed by the processor, may further cause the processor to utilize the maximum coefficients detected and localized at each resolution level to reconstruct the anticipated fault information for diagnostic and analysis.

Another embodiment is directed to a method for fault detection in substation feeders that may include receiving raw data samples of feeder currents and bus voltages at primary substations and at low voltage sides of distribution substations. The method may also include processing the raw data samples under at least one of a plurality of system operating modes. The method may further include monitoring normal operation and faults while operating under at least one of a plurality of system operating modes. The method may also include extracting fault information based on the monitoring. The method may further include reporting the fault information to a supervisory control and data acquisition system human-machine interface. The method may also include anticipating fault location based on an analysis of the fault information.

According to an embodiment, the method may further include processing the raw data samples of the feeder currents and bus voltages at the primary substations outgoing feeders and at a low voltage side of substation distribution transformers. In an embodiment, one of the operating modes may include a real-time sampling mode. According to an embodiment, the method may also include measuring the magnitude of line currents and phase voltages, and defining phase shift angles of the line currents and phase voltages with reference to a global positioning system of distribution substation smart meters. In an embodiment, the method may further include defining synchrophasor measurements with reference to the global positioning system at both primary substation outgoing feeders and distribution substation low voltage sides. According to an embodiment, the method may also include utilizing current and voltage phasor measurements phasor measuring units and a fault location matrix to define faulty feeder section locations. In an embodiment, the method may further include utilizing the phasor measuring units utilizing current and voltage phasor measurements to define the location of the fault in a feeder section.

Another embodiment is directed to an apparatus for fault detection in feeders between primary substation and distribution substation in ring systems. The apparatus may include at least one processor, and at least one memory including computer program code. The at least one memory and the computer program code may be configured, with the at least one processor, to cause the apparatus at least to receive raw data samples of line currents and phase voltages. The at least one memory and the computer program code may also be configured, with the at least one processor, to cause the apparatus at least to process the raw data samples under at least one of a plurality of system operating modes. The at least one memory and the computer program code may further be configured, with the at least one processor, to cause the apparatus at least to monitor normal operation and faults while operating under at least one of the system operating modes. The at least one memory and the computer program code may also be configured, with the at least one processor, to cause the apparatus at least to extract faulty feeder section and fault location information. The at least one memory and the computer program code may further be configured, with the at least one processor, to cause the apparatus at least to report the faulty feeder section and fault location information to a supervisory control and data acquisition system human-machine interface.

According to an embodiment, one of the operating modes may include a real-time sampling mode. In an embodiment, the at least one memory and the computer program code may be configured, with the at least one processor, to cause the apparatus at least to extract synchrophasor measurements. According to an embodiment, the at least one memory and the computer program code may also be configured, with the at least one processor, to cause the apparatus to utilize synchrophasor measurements to detect at least one faulty feeder. In an embodiment, the at least one memory and the computer program code may further be configured, with the at least one processor, to cause the apparatus to utilize synchrophasor measurements to define the extracted faulty feeder section and fault location information.

Another embodiment is directed to a computer program, embodied on a non-transitory computer readable medium. The computer program, when executed by a processor, causes the processor to receive raw data samples of line currents and phase voltages. The computer program, when executed by the processor, may also cause the processor to process the raw data samples under real-time. The computer program, when executed by the processor, may further cause the processor to monitor normal operation and faults while operating. The computer program, when executed by the processor, may also cause the processor to extract faulty feeder information based on monitoring synchrophasors. The computer program, when executed by the processor, may further cause the processor to report the faulty feeder and fault information to a supervisory control and data acquisition system human-machine interface.

According to an embodiment, the computer program, when executed by the processor, may further cause the processor to extract synchrophasor measurements of line currents and phase voltages. In an embodiment, the computer program, when executed by the processor, may further cause the processor to detect a faulty feeder. According to an embodiment, the computer program, when executed by the processor, may also cause the processor to define the exact fault location.

Additional features, advantages, and embodiments of the invention are set forth or apparent from consideration of the following detailed description, drawings and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings:

FIG. 4(a) shows an exemplary PD signal of 504 samples captured during RTS, according to certain embodiments.

FIG. 4(b) shows an exemplary PD signal of 5004 samples captured during ETS at a low threshold, according to certain embodiments.

FIG. 4(c) shows an exemplary PD signal of 5004 samples captured during ETS at a medium threshold, according to certain embodiments.

FIG. 4(d) shows an exemplary PD signal of 5004 samples captured during ETS at a high threshold, according to certain embodiments.

Figure 1:
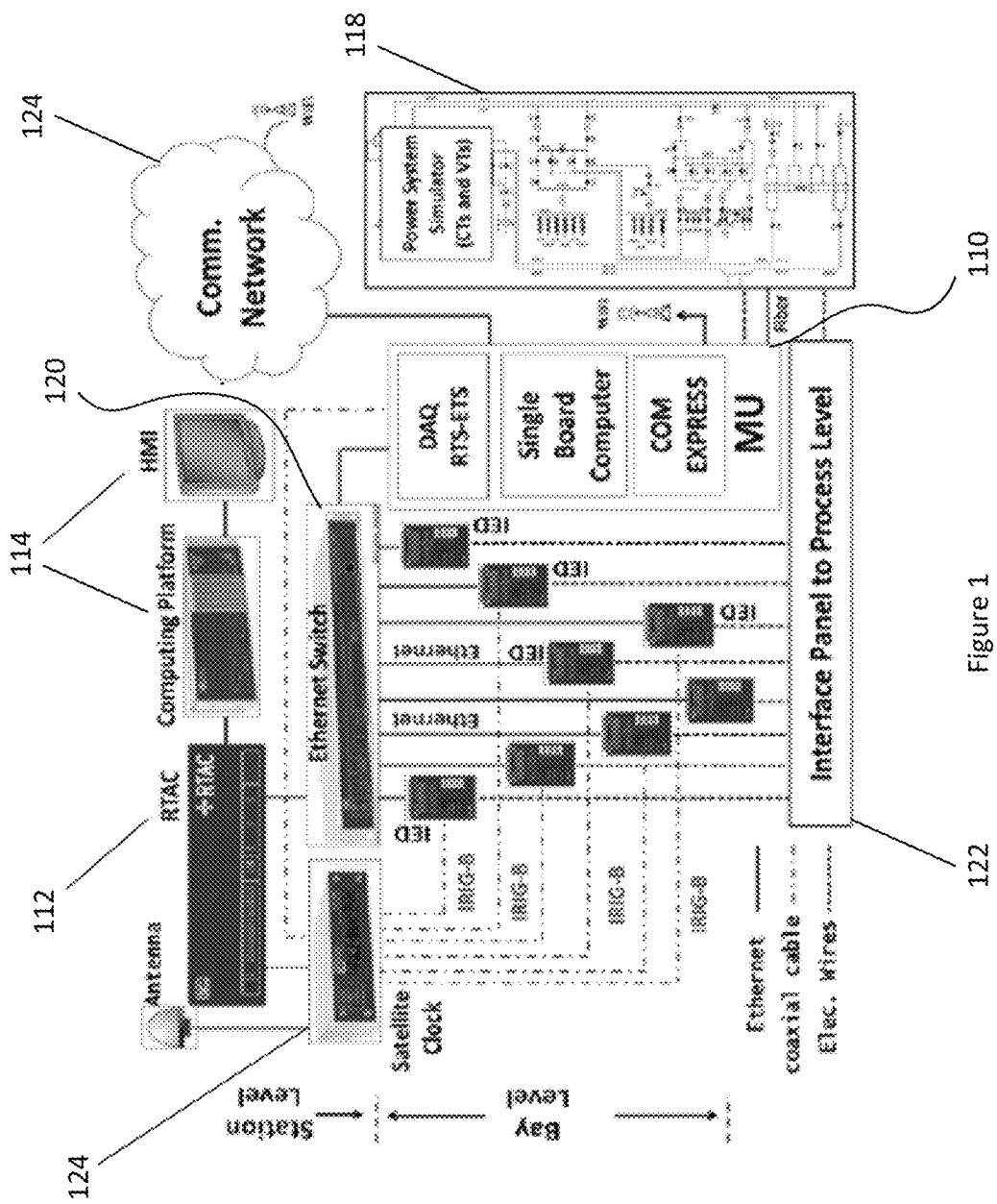
FIG. 1 shows an exemplary setup diagram of interfacing a smart merging unit (MU) with monitoring, processing, and communications devices, according to certain embodiments.

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical or structural changes may be made to the invention without departing from the spirit or scope of this disclosure. To avoid detail not necessary to enable those skilled in the art to practice the embodiments described herein, the description may omit certain information known to those skilled in the art. The following detailed description is, therefore, not to be taken in a limiting sense.

DETAILED DESCRIPTION OF THE INVENTION

The features, structures, or characteristics of the invention described throughout this specification may be combined in any suitable manner in one or more embodiments. For example, the usage of the phrases "certain embodiments," "some embodiments," or other similar language, throughout this specification refers to the fact that a particular feature, structure, or characteristic described in connection with the embodiment may be included in at least one embodiment of the present invention.

Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments. Additionally, if desired, the different functions discussed below may be performed in a different order and/or concurrently with each other. Furthermore, if desired, one or more of the described functions may be optional or may be combined. As such, the following description should be considered as merely illustrative of the principles, teachings and embodiments of this invention, and not in limitation thereof.

Any combination of one or more computer usable or computer readable medium(s) may be utilized in, with, or in conjunction with components and/or certain embodiments of the invention described herein. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk drive (HDD), a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. A computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out methods of certain embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

According to certain embodiments, it may be possible to provide an apparatus, system, and/or method for integrating operational and nonoperational data collected from primary and distribution substations as well as other distributed resources for developing SA features, which help self-healing algorithms to anticipate impending faults.

In certain embodiments, a smart International Electrotechnical Commission (IEC) 618850 merging unit (MU) with digital signal processing (DSP) and communication capability may be provided for continuous monitoring and diagnostics in power systems. The MU may facilitate self-healing during impending faults and support asset management functions. The MU may also be capable of monitoring, detecting, and anticipating equipment impending faults, including, for example, PD and high impedance arcs, which are not detected by intelligent electronic devices (IEDs).

A DSP dynamic wavelet-based windowing technique may be deployed in an MU, according to certain embodiments. This technique may be used in order to process signals and develop limited SA features, which may be reported locally and remotely to the SCADA system human-machine interface (HMI). The MU, according to certain embodiments, may exhibit the ability to anticipate and report early stages of impending faults that support decision makers to take proper remedial actions and prevent full-scale events.

Communication may be essential to support different smart grid functions such as self-healing, asset management, and wide area integrity. The IEC 61850 protocol allows high-speed Ethernet communication between different system nodes and offers a standardized configuration language and data model as well as interoperability. IEC 61850 considers IEDs (physical devices) as logical devices that are connected to a number of logical nodes (LNs), such as current transformers (CTs), VT, or distance protection (PDIS), in order to implement protection and control functions. These devices may be located within substations, feeders, or outside utility facilities such as wind farms, distributed storage systems, and smart meters. The LNs may be the core elements of information exchange. They may have the ability to share data based on client-server (read, write, control, report) or publisher-subscriber Generic Object Oriented Substation Events (GOOSE) messages or sampled values (SVs). The IEC 61850 MUs may be used to provide synchronized SVs and interface monitoring sensors at the process level with protection, metering, and control elements at bay.

Referring to FIG. 1, there is shown an exemplary setup diagram of interfacing a smart MU 110 with monitoring, processing, and communication devices, according to certain embodiments. The MU is integrated with a Real-Time Automation Controller (RTAC) 112 and a SCADA system 114. The MU 110 is integrated with a group of IEDs 116 to emulate a primary substation that control, protect, and communicate with a power system 118 (simulated using Hampden Power System Simulator-Model 180), as illustrated in FIG. 1. The MU 110 is also in communication with a communication network 124, and may communicate with the SCADA-HMI system 114 using either a direct Ethernet connection or a WiFi network.

In certain embodiments, under normal operation, the MU 110 may provide the SCADA-HMI system 114 with voltage magnitude and angle references to global positioning system (GPS) signals that support real-time system state estimation. The SCADA-HMI system 114 may also continuously tune an off-line network topology model.

In other embodiments, under abnormal operation, or impending faults, the tool, which may include the MU integrated with the system, may be capable of detecting and localizing disturbances in primary feeders and distribution substations' equipment, and anticipate their influence on the whole system. The MU 110 may quickly detect and localize distribution system faults and isolate faulty sections to avoid spread over of disruption, and enable rapid restoration and dynamic updating of protection settings based on actual system configurations. The MU 110 may also facilitate self-healing and support asset management functions.

The IEDs 116 (at bay level) may support the IEC-61850 protocol. The IEDs 116 may be connected using a 24-port Ethernet switch 120, managed by the RATC 112 at the station level. The IEDs 116 are integrated with process level using an interface panel 122. The IEDs 116 that support IEEE C37.118 for phasor measuring units (PMUs) may be synchronized using an integrated GPS via a satellite-synchronized clock 124 using Inter-range instrumentation group type B (IRIG-B) interface. The smart MU 110 in this setup may be configured to report PD/arc activities directly to the SCADA-HMI system 114 at the station level.

While simulator conventional CTs and VTs (LNs) 118 may be interfaced with IEDs 116 using wires, the MU 110 may be connected directly to the Ethernet switch 120 and interfaced with the process level 122 using conventional CTs. Converting a conventional MU to a smart MU may support real-time system state estimation, tune-offline network topology, provide self-healing to monitored devices and anticipate drop off system assets.

Figure 2:
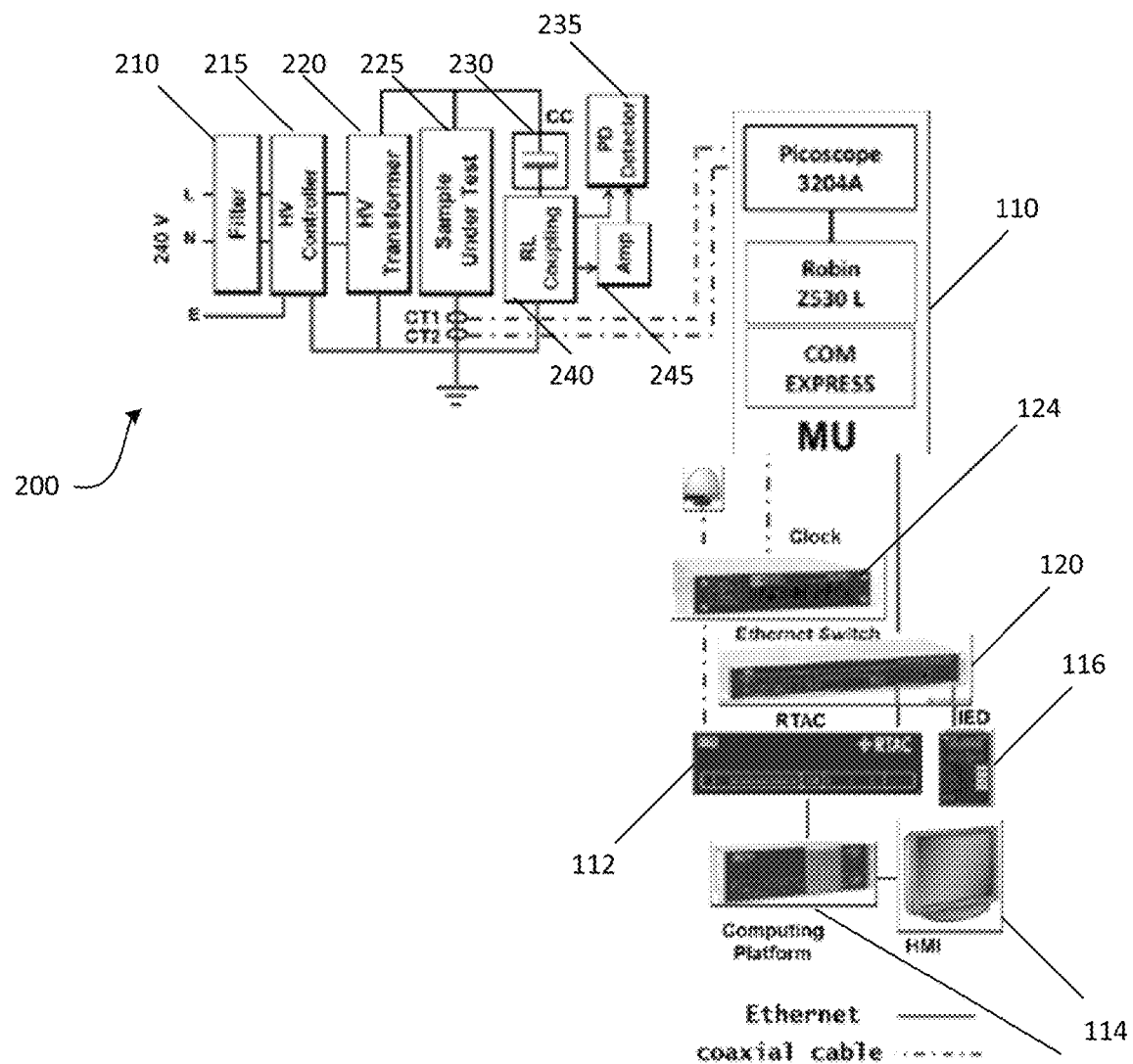
FIG. 2 shows an exemplary setup for PD detection and reporting, according to certain embodiments.

Referring to FIG. 2, there is shown an exemplary setup for PD detection and reporting, according to certain embodiments. FIG. 2 shows an exemplary setup of high voltage (HV) test equipment 200, and the components of a setup of the smart MU 110, according to certain embodiments. In an embodiment, the HV test equipment 200 may include a filter 210, HV controller 215, HV transformer 220, sample under test unit 225, a coupling capacitor (CC) 230, a PD detector unit (PD2U) 235, and an RL coupling unit 240.

The setup includes high voltage (HV) test equipment, namely RTAC 112, IED 116 for transformer protection, satellite synchronized clock 124, Ethernet switch 120, and SCADA-HMI system 114. The HV test equipment 200 with controllable high voltage source, such as, for example, 100/50 kV or 75/150 mA, may be used to generate controllable PDs and/or arcs during air insulation breakdown. The PD/arc monitoring circuit may include a preamplifier of a 40-800 kHz frequency range and quadrupoles may consist of an inductor in parallel with a damping resistor to form with a high voltage CC 230, a second order high pass filter. The quadrupoles may be up to 100 kV, 1.0 nF Cap, 400 mA max.

Also shown in FIG. 2 are two wide band width CTs, CT1 and CT2. CT1 may be of about 1.0 Hz to about 20 MHz, and CT2 may be of about 200 Hz to 500 about MHz. The bandwidth CTs may be used to offer current measurements from micro-amps to 70 amps (rms) and cover a broad frequency range (about 1.0 Hz to about 500 MHz). Two CTs with different bandwidths may be used to study the impact of RTS and ETS on the resolution of the captured signals.

According to certain embodiments, a Robin Z530 may be used to implement the smart MU 110. The Robin Z530 may be a single board computer that is integrated with a COM Express carrier board and a data acquisition system. Further, a Picoscope 3204A may be utilized as a data acquisition system with high bandwidth to cover a wide range of expected distorted signals in a power system. The Picoscope 3204A may have a 60 MHz bandwidth and a maximum sampling rate of 500 MS/s for RTS operation mode and up to 2.5 GS/s for repetitive signals during ETS operation mode.

In certain embodiments, the smart MU 110 may detect and process PD/arc signals, quantify, and report their significance. In other embodiments, hardware components of the smart MU 110 may combine high performance computing with low power consumption for embedded monitoring systems. The carrier board may utilize as many of the I/O interfaces connectors required to interface the smart MU 110 to the Ethernet switch 120 and the RTAC 112 via universal serial bus (BUS) ports and a Gigabit local area network (LAN) interface.

According to certain embodiments, defining the proper sensors and MU component bandwidths to detect impending faults may be essential for data collection, processing, and exchange. The captured signals may have a high sampling rate that are well-matched with expected frequency bands to be monitored. Furthermore, the bandwidth of the measuring instructions (VT, CT1, and CT2) may be compatible with the bandwidth of the A/D card of the MU.

With reference to Table 1, there is shown different frequency bands utilized for signal processing, measuring instruments, and data acquisition based on RTS or ETS operation modes. While the RTS method may acquire samples fast enough to reconstruct the original signal within their bandwidth and dynamic range, the ETS method may emulate real-time sampling and allow capturing of high frequency signals with a much higher effective sampling rate. This may be important for detecting blurred symptoms of impending faults and understanding event development.

TABLE 1

Processing and instruments frequency bands.

| Wavelet Multi-resolutions | | Measuring Instruments | | MU Operation Mode | |
|---|---|---|---|---|---|
| Resolution Level | From-To (Approximated bandwidth, MHz) | CT1 | CT2 | RTS | ETS |
| | | Bandwidth | | (or samples/s) | |
| D1 | 1250    625 | | | | 60 MHz |
| D2 | 625    313 | | | | (2500 |

TABLE 1-continued

Processing and instruments frequency bands.

| Wavelet Multi-resolutions | | Measuring Instruments | | MU Operation Mode | |
|---|---|---|---|---|---|
| Reso-lution Level | From-To (Approximated bandwidth, MHz) | CT1 | CT2 Bandwidth | RTS (or samples/s) | ETS |
| D3 | 313 | 156 | | 500 MHz | | Ms/s) |
| D4 | 156 | 78 | | | |
| D5 | 78 | 39 | | | 60 MHz |
| D6 | 39 | 20 | 20 MHz | | (500 |
| D7 | 20 | 10 | | | Ms/s) |
| D8 | 10 | 5 | | | |
| A8 | 5 | DC | | | |

In certain embodiments, the ETS data capturing mode may utilize a repetitive digitizing process to generate smaller sample intervals that the actual digitizer exhibits, and develop apparent high sampling rate where wealthy information can be extracted. This operation mode may provide a solution to integrate different components of different bandwidths and generate signals with high resolutions beyond the capability of merging unit data acquisition systems (MU-DAQ) or other interfacing CTs. The ETS may impose repetitive acquisitions and disable real-time application which is not a significant factor in monitoring impending faults that develop over time with blurred symptoms.

Figure 3A:
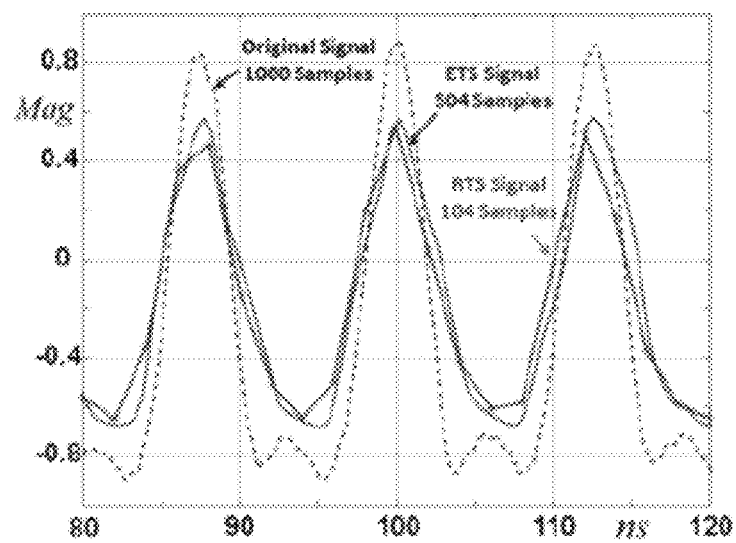
FIG. 3(a) shows an exemplary comparison of real-time sampling (RTS) and estimated time sampling (ETS) modes in a time domain, according to certain embodiments.
Figure 3B:
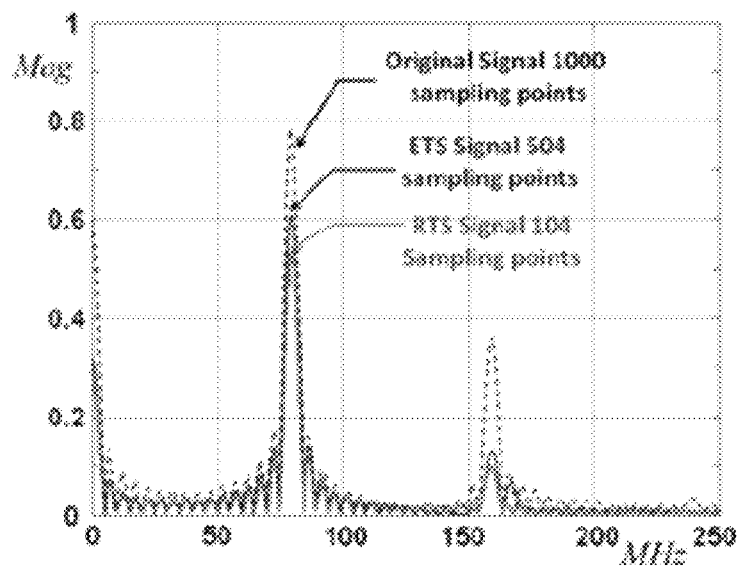
FIG. 3(b) shows another exemplary comparison of RTS and ETS modes in a frequency domain, according to certain embodiments.

Referring to FIGS. 3(a) and 3(b), there is shown an exemplary comparisons of real-time sampling (RTS) and estimated time sampling (ETS) modes in a time and frequency domain, according to certain embodiments. FIGS. 3(a) and 3(b) illustrate the impact of the RTS and ETS modes in time and frequency domains when excited by a simulated impulsive voltage with controllable frequency and amplitude. The original impulsive signal of 1000 samples, 3.5 us width, and 80 MHz frequency is generated using a Keithley 3402, 165 MHz Pulse/Pattern Generator. The RTS and ETS operating modes captured this signal using 104 and 504 samples, respectively. While the bandwidth of the acquisition unit is limited by 60 MHz, the roll-off bandwidth of the acquisition unit supports the appearance of additional high frequency details beyond DAQ limitation under the ETS operation mode. Under the ETS mode, better resolution may be used to anticipate impending faults, monitor their development, determine the underlying cause, an specify their locations.

The repetitive and non-stationary nature of PD/arc signals presents another challenge to define a proper trigger value in magnitude during the ETS repetitive-digitizing process. An inaccurate low magnitude trigger may generate raw data of high resolution, however, it also magnifies jitter burden of the captured signal as compared with the RTS acquisition. Selecting a suitable high trigger may resolve the jitter issue and generate raw data of high resolution to quantify the blurred symptoms.

Referring to FIGS. 4(a) to 4(d), there is shown a non-stationary nature of the PD signals, operation modes, and measuring instruments have direct impact on the captured waveforms. FIG. 4(a), shows the PD signal of 504 samples captured during RTS. Activating the ETS mode results in signals that have high resolution (for example, 5004 samples), as shown in FIGS. 4(b), 4(c), and 4(d). From these figures, wealthy information may be extracted and decomposed to multi-frequency bands. Further, as shown in FIGS. 4(b) and 4(c), selecting low-magnitude trigger may generate signals with a high sampling rate and high jitter. This high jitter generates superficial high frequency components which may impact the extracted information of blurred symptoms from the ETS signals. However, selecting an accurate (high) magnitude trigger may generate ETS signals (FIG. 4(d)) with high resolution (5004 samples) and wealthy information and imitate the low resolution RTS signal (504) samples illustrated in FIG. 4(a).

Figure 5:
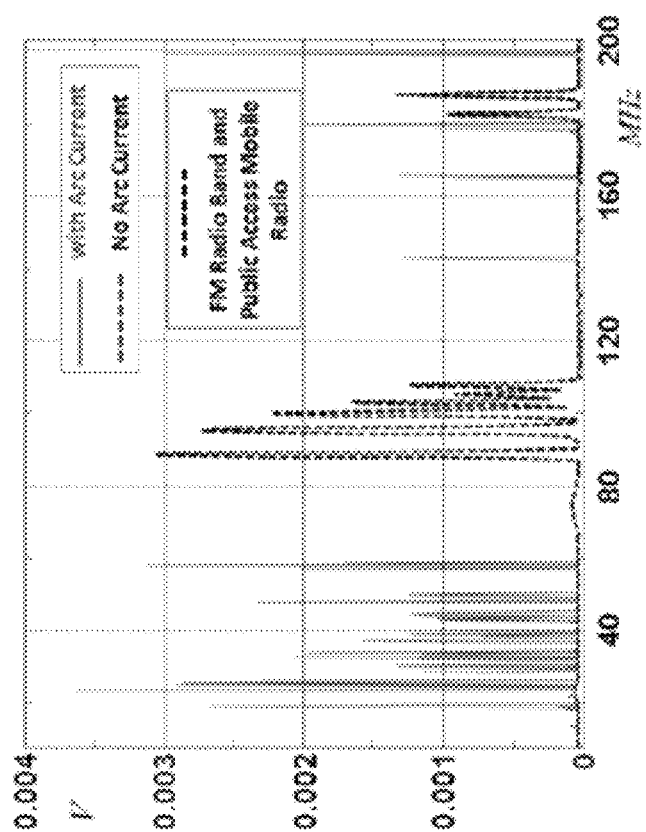
FIG. 5 shows an exemplary electromagnetic interference (EMI) generated during arcs, according to certain embodiments.

Referring to FIG. 5, there is shown an exemplary electromagnetic interference (EMI) generated during arcs, according to certain embodiments. There is also shown the impact of EMI due to PDs and arcs, on data transfer from the MU. In an embodiment, a spectrum analyzer integrated with a directional antenna of 20-200 MHz bandwidth may be used to monitor and investigate the surrounding electromagnetic waves during PDs, sparks, and arcs. The most significant frequency components captured from the surrounding during normal operation condition (dashed lines) are in the band 85-115 MHz (the FM radio band), and 170-190 MHz (Public Access Mobile Radio). Alongside the existing frequency components, there are new components that appear during arcs, mainly in the range of 20-60 MHz and 140-200 MHz. A broadband antenna that works at 2.4 GHz and 5 GHz frequency bands may also be used to investigate the effect of arcs on different wireless communication channels. According to certain embodiments, early stages of arcs (not detectable by IEDs) do not generate any significant frequency components higher than 200 MHz.

In certain embodiments, the smart MU may provide a cost-effective solution for both asset management and self-healing functions. In these applications, the MU may process non-operational ETS data of a transformer's grounding current, and report a limited set of SA features. These features may support the SCADA system operators to continue monitoring, anticipate impending faults, and quantify their influence to trigger full-scale fault. During any stage of SA reporting, system operators may further process the non-operational data (waveforms) locally at the MU or remotely at the station level to support asset management functions.

According to certain embodiments, the MU information reporting to a SCADA system may be based on IEEE 802.11a. The WiFi-5 GHz standard specifies twelve non-overlapping channels in the unlicensed national information infrastructure (U-NII) radio band. The MU may operate in different frequency ranges including, for example, lower, middle, and upper. In other embodiments, the MU may operate in frequency ranges over the 5.0 GHz band. Each channel may support up to 54 Mbps data rate with a maximum bandwidth of 18 MHz. The availability of 12 channels in IEEE 802.11a may allow the selection of channels that are not utilized by close neighborhoods of the MU. Controlling the volume of transmitted voltage, current samples, or extracted features may lead to sufficiently low data transfer latency. Fast data transfer may be achieved either by using high bandwidth or by reducing the amount of data to be transferred.

In certain embodiments, it may be possible to monitor the effect of sensed information volume on data transfer throughput where the PD current signal samples are transferred over a WiFi-5 GHz link. In other embodiments, different non-operational ETS/RTS and SA data sets may be collected and transferred wirelessly from the MU to an access point, such as, for example, a wireless router, and then to a laptop, or any similar computer device. The laptop may be connected to the wireless router using an Ethernet connection. Files may be transferred using a file transfer protocol (FTP), which may run over a transmission control protocol (TCP), in order to achieve reliable data transfer.

According to certain embodiments, ETS/RTS files may be used with different numbers of sampling points. Each file may include the PD current samples, the sampling interval, and the starting time of the first sample.

Figure 6:
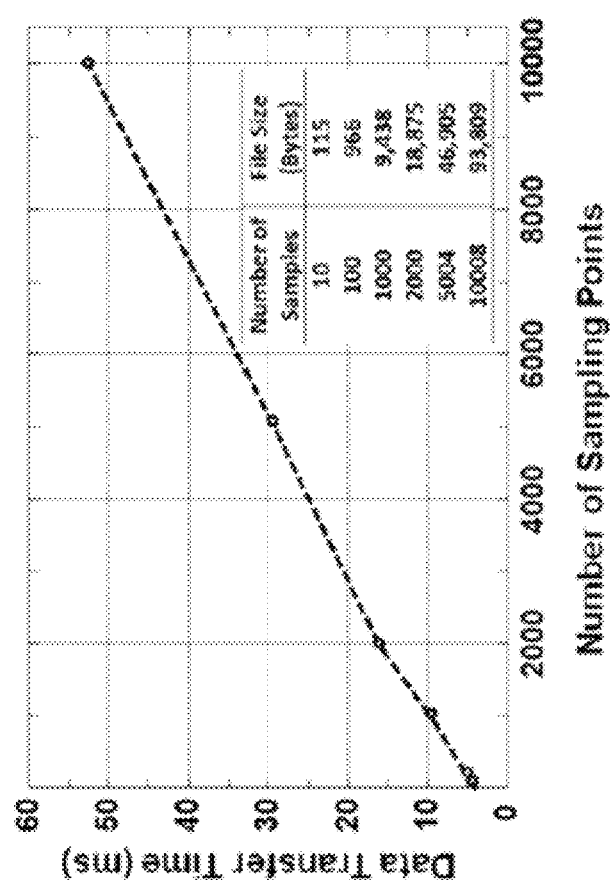
FIG. 6 shows an exemplary data transfer time for different number of samples and file sizes, according to certain embodiments.

Referring to FIG. 6, there is shown an exemplary data transfer time for different number of samples and file sizes, according to certain embodiments. FIG. 6 reveals a slow increase in the data transfer time at a small number of sampling points (up to 2,000 samples), then a faster linear increasing trend prevails. This is due to the fact that a TCP connection has to be established for every data file transfer. The TCP connection setup time may be fixed. However, its value may constitute a significant overhead that is comparable to the transfer time of small files (small number of sampling pivots). For a large number of sampling points, such as, for example, over 2,000, the increasing trend is linear since the TCP connection setup time becomes insignificant compared with the data transfer time.

FIG. 6 also reveals that a significant reduction in the data transfer latency may be obtained if the number of transmitted sampling points is decreased from 5,004 samples to 100 samples or less. This indicates the possibility of sending SA data to the RTAC within a very short time. In certain embodiments, sending SA data to the RTAC may be around 5 ms or less.

According to certain embodiments, for PD/arcs activity, the monitoring system may start monitoring normal operation conditions, which may include only noise or PDs with an allowable limit. The monitoring system may also develop reference features locally and also globally. Then, any progress in PDs may be detected, localized, and reported to the SCADA.

According to certain embodiments, there may be two operating modes of the MU, including RTS and ETS. These operating modes may be utilized to monitor normal operation and impending faults. In both modes, the overall data communication overhead may be reduced by processing the data at the MU. An enhanced DSP wavelet based technique may reduce the non-operational data size of a high sampling rate to a limited set of SA report of a manageable size for wireless communication. The PD signal i(t) may be presented as a series of approximate $c_j(k)$ coefficients and detail $d_j(k)$ coefficients:

$$i(t) = \sum_k c_o(k)\phi(t-k) + \sum_k \sum_{j=0}^{J-1} d_j(k)2^{j/2}\psi(2^j t - k) \quad (1)$$

In equation (1), the PD signal i(t) may be presented as a series of expansion coefficients and a combination of a scaling function and a wavelet function. In addition, k represents the translation coefficient, $c_o$ represents the j level (j=0) scaling coefficient, and $d_j$ represents the j level wavelet coefficient. Further, c(k) represents the wavelet approximate coefficients, d(k) represents wavelet detail coefficients, $\psi(t)$ represents a wavelet function, and $\phi(t)$ represents a scaling function.

According to certain embodiments, these coefficients may be extracted after decomposing the PD signal into different resolution levels. The used mother wavelet and the magnitude of the PD signal may affect their magnitudes and locations at different resolution levels.

The non-stationary and impulsive nature of the PDs and arcs may impose dissipation of their energy in the wavelet domain among adjacent resolution levels. Significant improvement in reducing energy dissipation may be achieved by increasing the similarity of the expansion system ($\chi_{k,n}(t)$) and the processed signal. In certain embodiments, the expansion system that represents the selected mother wavelet that generates approximate and detail coefficients. The selected mother wavelet is used to decompose a signal into multi-resolution levels. This fact of energy dissipation of nonstationary signals while decomposed into wavelet domain may be utilized to optimize the data processing window size, window shape, sliding rate, and the optimal mother wavelet to be selected to extract SA features. The windowing version of the signal may be represented in terms of a windowing version of the expansion coefficients $wc_j(k)$ as:

$$wi(t) = \sum_{k,n} wc_j(k)\chi_{k,n}(t) \quad (2)$$

Here, the variable k is the time index and n is a frequency index. Using orthogonality of the basic functions, the expansion coefficients may be presented as:

$$wc_j(k) = \langle w_k(t)i(t), \psi(t) \rangle \quad (3)$$

Kaiser's window of length $w_N$ may be selected in the windowing process, which may be mathematically presented as:

$$w[n] = \frac{I_o\{\beta[1-(n-u)^2/u^2]^{0.5}\}}{I_o(\beta(0,\alpha))} \quad (4)$$

for $n = 0, 1, \ldots, w_N - 1$

According to equation (4), β and α represent Kaiser's window parameters that define the window shape in the time domain. In certain embodiments, the window shape may be varied by changing the α parameter.

Here, $I_o(x)$ is the modified Bessel function, u is the midpoint of the window function. Using Mallat's algorithm, the set of detail expansion coefficients resulted from a windowing version of the signal at a certain resolution, j, can be defined as:

$$wd_j(k) = \sum_m h_1(m-2k)wc_{j+1}(m) \quad (5)$$

According to equation (5), $h_j(k)$ represents coefficients of the selected wavelet function, $wd_j$ represents the windowing version of the expansion detail coefficients, and $wc_j$ represents the windowing version of the expansion approximate coefficients.

The monitoring and defining of the maximum coefficients detected and localized at each resolution level (Max $(wd_j)_{sig}$) for each window center may be utilized to extract and estimate PD signals embedded in excessive noise using a limited set of numbers. The optimal processing window parameters ($K_{opt}$) may be defined by processing the raw data of grounding currents multiple times. For each processing cycle, for example, Kaiser's window shape, size, sliding rate, and selected mother wavelet may be adjusted until having Max $(wd_j)_{sig}$ localized at the same window center $w_c$ for the largest number of adjacent resolution levels. Hence the $K_{opt}$ used to develop the SA features Max $(wd_j)_{sig}$ for each resolution level to anticipate impending faults. The optimal processing window parameters ($K_{opt}$) may be defined as discussed below.

For a given windowing parameter ($w_N$, $\alpha$, and $N_s$), and as data slide into Kaiser's window, the Max $(wd_j)_c$ and their associated window center location $w_c$ for all resolution levels may mathematically be presented by the following matrix:

Kaiser's window center $$\text{wavelet resolution levels} \begin{bmatrix} \text{Max}(wd_1)_{c1} & \underline{\text{Max}(wd_1)_{c2}} & \cdots & \text{Max}(wd_1)_{cm} & \cdots & \text{Max}(wd_1)_{cn} \\ \text{Max}(wd_2)_{c1} & \text{Max}(wd_2)_{c2} & \cdots & \underline{\text{Max}(wd_2)_{cm}} & \cdots & \text{Max}(wd_2)_{cn} \\ \vdots & \vdots & \vdots & \vdots & \vdots & \vdots \\ \underline{\text{Max}(wd_4)_{c1}} & \text{Max}(wd_4)_{c2} & \cdots & \text{Max}(wd_4)_{cm} & \cdots & \text{Max}(wd_4)_{cn} \\ \text{Max}(wd_5)_{c1} & \text{Max}(wd_5)_{c2} & \cdots & \underline{\text{Max}(wd_5)_{cm}} & \cdots & \text{Max}(wd_5)_{cn} \\ \text{Max}(wd_6)_{c1} & \underline{\text{Max}(wd_6)_{c2}} & \cdots & \text{Max}(wd_6)_{cm} & \cdots & \text{Max}(wd_6)_{cn} \\ \vdots & \vdots & \vdots & \vdots & \vdots & \vdots \\ \text{Max}(wd_{j-j})_{c1} & \text{Max}(wd_{j-j})_{c2} & \cdots & \text{Max}(wd_{j-j})_{cm} & \cdots & \underline{\text{Max}(wd_{j-j})_{cn}} \\ \text{Max}(wd_j)_{c1} & \underline{\text{Max}(wd_j)_{c2}} & \cdots & \text{Max}(wd_j)_{cm} & \cdots & \text{Max}(wd_j)_{cn} \end{bmatrix}$$

Here, the rows represent the wavelet resolution levels (1 to J), and the columns represent the maximum coefficients Max $(wd_j)_c$ at each Kaiser's window center. The underlined elements represent Max $(wd_j)_c$ that has a maximum magnitude at each resolution level among all Kaiser's window centers.

New processing cycles may be started, and the window size parameter ($w_{N1}, w_{N2}, \ldots w_{Nn}$) may be modified. Further, the window shape parameters ($\alpha_1, \alpha_2, \ldots \alpha_n$) and the sliding rate $N_s$ may be modified until a set of Max $(wd_j)$ is developed, which has at least three elements localized at three adjacent resolution levels, and having the same window center $w_c$ and provide maximum magnitudes of Max $(wd_j)$. Three adjacent resolutions, which represent the worst detection scenario in high noise signals, is selected considering the fact that mapping a non-stationary and impulsive PD shape may impose dissipation of its energy among some adjacent resolution levels. The selection of a combination of the optimal window parameters and mother wavelet ($w_{N,opt}$, $\alpha_{opt}$, $N_{s,opt}$, $\psi$) may generate SA features with high values and localized at the same window center $w_c$, as presented by a dashed block in the following matrix:

$$\begin{bmatrix} \text{Max}(wd_1)_{c1} & \text{Max}(wd_1)_{c2} & \cdots & \text{Max}(wd_1)_{cm} & \cdots & \text{Max}(wd_1)_{cn} \\ \text{Max}(wd_2)_{c1} & \text{Max}(wd_2)_{c2} & \cdots & \text{Max}(wd_2)_{cm} & \cdots & \text{Max}(wd_2)_{cn} \\ \vdots & \vdots & \vdots & \vdots & \vdots & \vdots \\ \text{Max}(wd_4)_{c1} & \text{Max}(wd_4)_{c2} & \cdots & \text{Max}(wd_4)_{cm} & \cdots & \text{Max}(wd_4)_{cn} \\ \text{Max}(wd_5)_{c1} & \text{Max}(wd_5)_{c2} & \cdots & \text{Max}(wd_5)_{cm} & \cdots & \text{Max}(wd_5)_{cn} \\ \text{Max}(wd_6)_{c1} & \text{Max}(wd_6)_{c2} & \cdots & \text{Max}(wd_6)_{cm} & \cdots & \text{Max}(wd_6)_{cn} \\ \vdots & \vdots & \vdots & \vdots & \vdots & \vdots \\ \text{Max}(wd_{j-1})_{c1} & \text{Max}(wd_{j-1})_{c2} & \cdots & \text{Max}(wd_{j-1})_{cm} & \cdots & \text{Max}(wd_{j-1})_{cn} \\ \text{Max}(wd_j)_{c1} & \underline{\text{Max}(wd_j)_{c2}} & \cdots & \text{Max}(wd_j)_{cm} & \cdots & \text{Max}(wd_j)_{cn} \end{bmatrix}$$

According to certain embodiments, the MU may process the captured data in two stages to serve self-healing and asset management functions. The first stage may be used to develop SA features of impending faults in transformers using PD activities or arcs that are not detectable by IEDs. This stage may be influenced by the magnitude of Max $(wd_j)_c$ and their locations. The second stage may be activated based on the SA features' report and used mainly by asset management functions.

Figure 7B:
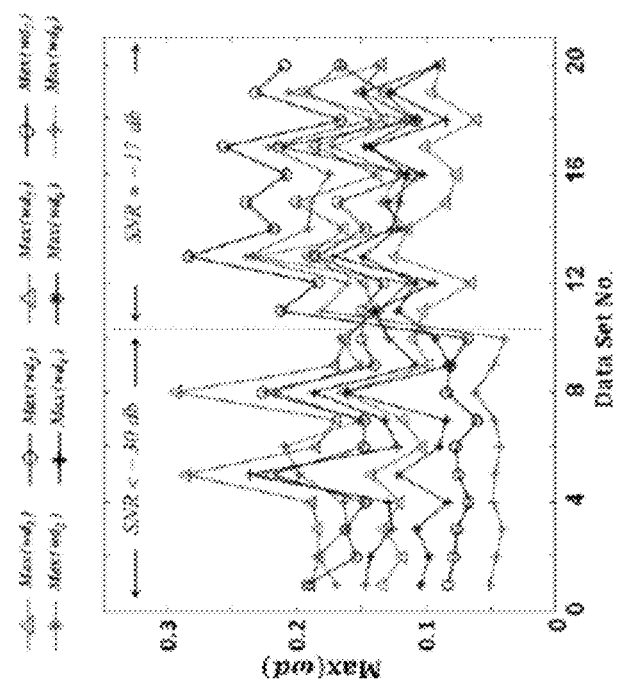
FIG. 7(b) shows another exemplary SA feature extraction stage applied on 20 scaled down laboratory PD signals masked with simulated noise, according to certain embodiments.
Figure 7A:
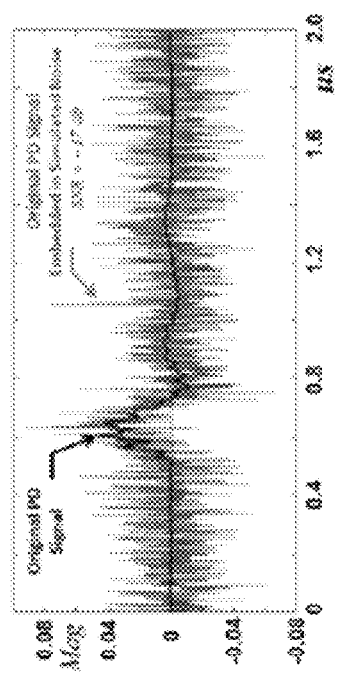
FIG. 7(a) shows an exemplary situation awareness (SA) feature extraction stage applied on 20 scaled down laboratory PD signals masked with simulated noise, according to certain embodiments.

Referring to FIGS. 7(a) to 7(d), there is shown the SA feature extraction stage applied on 20 scaled down PD signals masked with simulated noise, according to certain embodiments. For example, in the first stage, the data may be initially processed locally in the MU to monitor early stages of impending faults. The first 10 signals are corrupted with a very high simulated signal-to-noise ratio (SNR) of SNR<−30 dB, and the other 10 signals have SNR around −17 dB, as shown in FIG. 7(a). The SA features to anticipate an impending fault may be concluded from FIGS. 7(b) and 7(c), which illustrate the relationship between the Max $(wd_j)_c$ at different resolution levels, their magnitude variations, as well as their time locations.

Figure 7C:
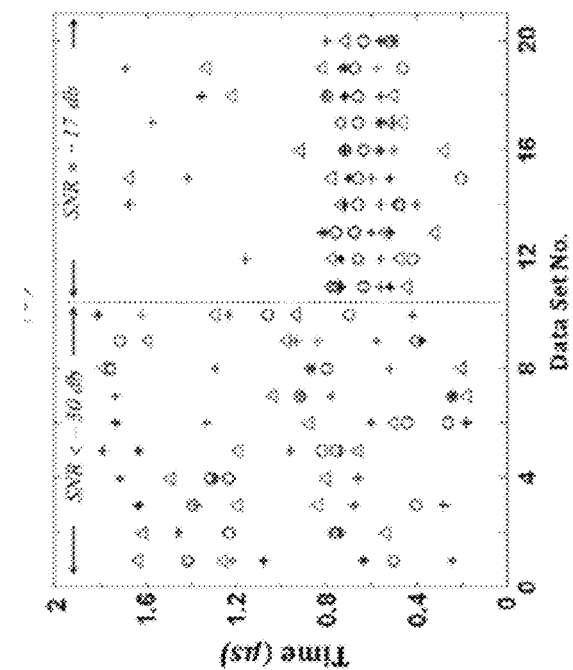
FIG. 7(c) shows yet another exemplary SA feature extraction stage applied on 20 scaled down laboratory PD signals masked with simulated noise, according to certain embodiments.

For the first 10 signals with SNR<−30 dB, the Max $(wd_j)_c$ time locations are randomly distributed in time, and their magnitudes do not have a regular pattern. However, as the simulated noise level decreases to SNR=−17 dB, or the PD magnitude increasing the Max $(wd_j)_c$ are localized adjacent to each other, their magnitude patterns changed based on the coefficients that have large values ($wd_7$ and $wd_8$) as shown in FIGS. 7(b) and 7(c). The data constitutes 20 ETS-signals, each of 5,004 samples. However, in stage 1, according to certain embodiments, it may be possible to focus on SA features that map each ETS signal into 16 numbers based on Max $(wd_j)_c$ magnitudes and locations. These limited sets of SA features may be reported to the SCADA system to support decision making personnel to proceed, whenever required, to stage 2.

According to certain embodiments, possible actions to be performed upon receiving the report at the SCADA system may be different depending on the PD features. For example, if the PD features are stable within an allowable limit, then continuous monitoring, comparisons with similar equipment, and generating reference features may be performed. If the PD features are changing, for example, PD increase, then maintenance should be scheduled, and an off-line system model to support reliable system operation during equipment disconnection may be used. If, however, the PD features are increasing toward an arc, then protection action may be initiated, power may be disconnected, and use of the off-line system model to support rerouting for supplying disconnected loads may be performed.

In certain embodiments, the processing capability of the MU may make it more powerful to develop an event-driven network and report-by-exception whenever the developed sets of SA features exceed a predefined number. For example, 20 to 32 sets may be used in one application. The processor in the MU may open the communication port and the SCADA as client requests from the MU, as a server, to send 16 holding register values that represent the Max $(wd_j)_c$ magnitudes and their locations for each triggered signal. This operation may be implemented on all of the triggered signals. The MU may then close the communication port with the SCADA to stop requesting new coefficients.

Figure 8:
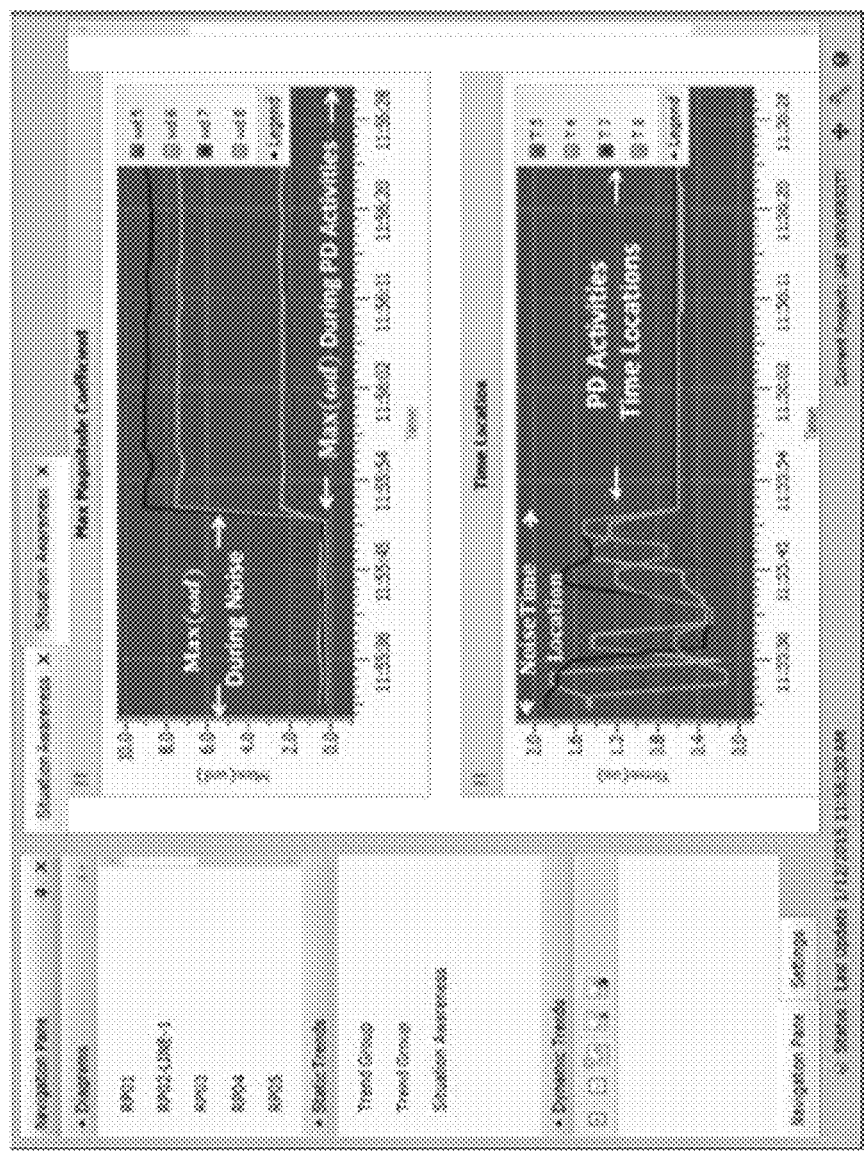
FIG. 8 shows exemplary impending fault SA features magnitude and location variations in a human-machine interface (HMI) supervisory control and data acquisition (SCADA) system, according to certain embodiments.

Referring to FIG. 8, there is shown an exemplary impending fault SA features magnitude and location variations in the HMI SCADA system. The Max $(wd_j)_c$ SA features are presented as a trend in SCADA, as shown in FIG. 8. Here, four magnitudes and locations of Max $(wd_5)$ to Max $(wd_8)$ for the most obvious levels are presented. The x-axes represent the SCADA system reporting instant, and the y-axes represent the Max $(wd_j)_c$ magnitudes (upper) or their actual time stamp instant (lower). The first part of the trend shows only noise results, whereas the rest of the trend illustrates the appearance of PD activities. Change in the Max $(wd_j)_c$ magnitudes generates another SA set, and open communication with the SCADA system to report the severity of an impending fault.

In certain embodiments, stage 2 may support the development of intelligent condition monitoring techniques for efficient handling of large volumes of data. This stage may also be used to build a relationship between the monitored data and the equipment conditions. The actual or estimated captured waveform of the PD activity and their development progress may be used to develop health assessment and prognostic techniques. These techniques may be used to generate diagnostic records, propose failure possibilities, and estimate equipment future health and their remaining useful life.

Certain embodiments may utilize the wavelet coefficients that have adjacent Max $(wd_j)_c$ to reconstruct the PD waveform for diagnostic and analysis. This reconstruction process may be performed locally at the MU. Alternatively, coefficients with significant impact may be communicated and estimation/reconstruction may be performed at the remote monitoring station. Reconstruction may be based on the features (16 numbers) may be used to detect changes in PD activities, and have an idea about PD/arc progress for control and protection. Reconstruction may also be based on the wavelet coefficients used to estimate PD pulse shape for asset management application. In addition, the size of the estimated PD signal can be varied to match the available communication/storing capability.

Figure 9:
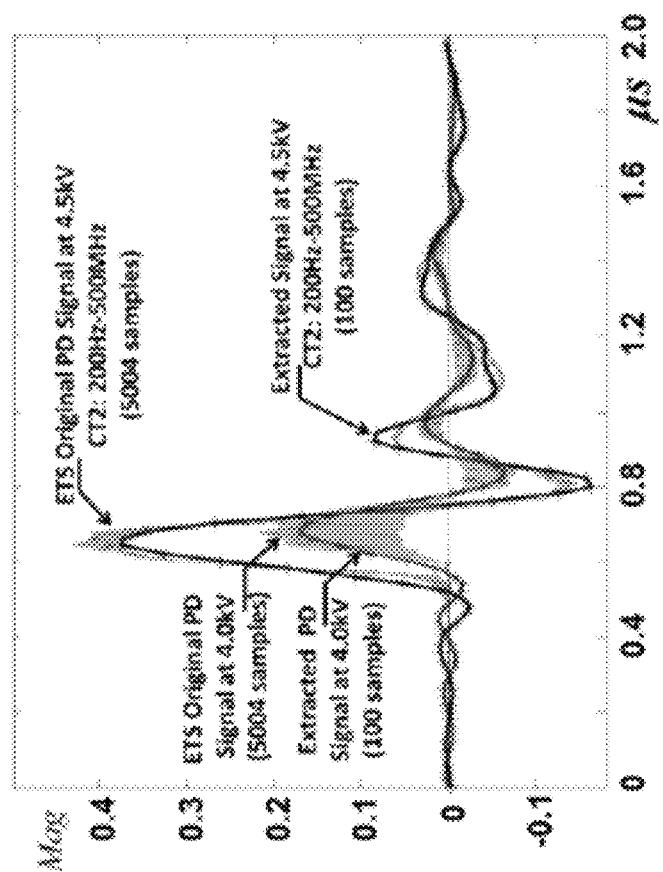
FIG. 9 shows an exemplary captured ETS PD signals and their estimated version, according to certain embodiments.

Referring to FIG. 9, there is shown an exemplary captured ETS PD signals and their estimated version, according to certain embodiments. The original ETS based PD activity and its estimated version may be captured using CT2 while applying different voltages. The size of the estimated PD signal may be varied between 100 and 4005 sampling points to match the available communication capability.

In certain embodiments, the SA features may correspond to Max $(wd_j)_c$ in monitoring partial discharge and high impedance arcs. The SA features may also correspond to monitoring normal operation conditions or faults. In this situation, the bus voltage at each substation and the load current may be available with their angles reference to GPS signals, and the MU may function as a phasor measurement unit (PMU). In other embodiments, the SA features may correspond to monitoring feeder faults and define the fault location. As will be discussed in detail below, a faulty feeder-section can be defined as using the following fault location matrix:

$$[FL]_{i(i+1)} = [\Delta M]_1^{Fault} \cdot [\Delta M]_2^{Fault} \neq 0 \quad (6)$$

The final results may show $FL_{i(i+1)} \neq 0$ at the faulty transmission lines between bus i and i+1, while all other elements of [FL] will be 0.

Figure 10:
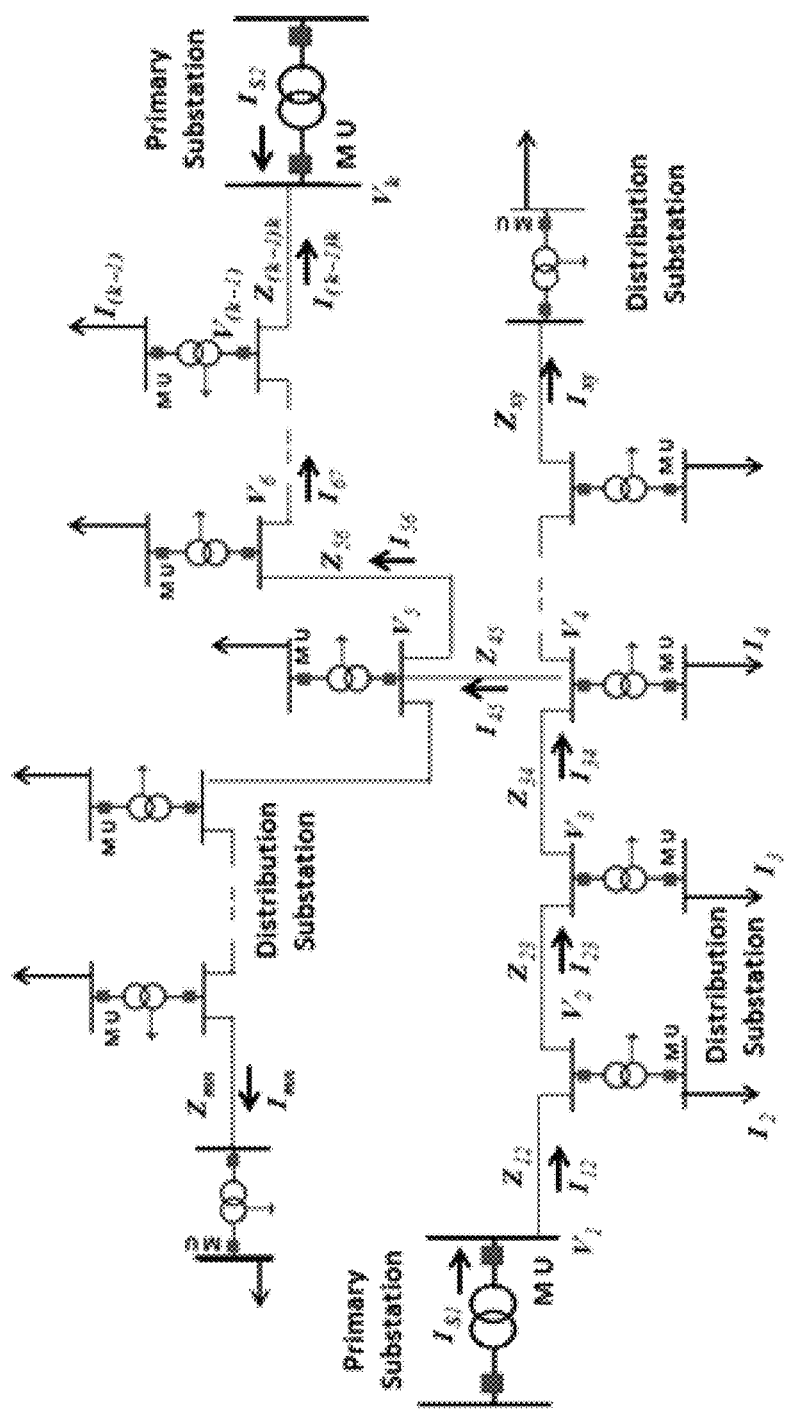
FIG. 10 shows an exemplary schematic of a configuration of feeder end sources and feeder section currents, according to certain embodiments.

Referring to FIG. 10, there is shown an exemplary schematic of a configuration of feeder end sources and feeder section currents, according to certain embodiments. In an embodiment, distribution substation smart meters may be upgraded with the MU such that the bus voltage at each substation and the load current are available with their angles reference to GPS signals. The source current at each primary feeder may be available with their angles referenced to GPS.

According to certain embodiments, during normal operation conditions (NOC), feeder section currents starting from feeder end sources may be monitored. The currents in each feeder-section may be determined between two primary substations, which may include Source 1 and Source 2, as shown in FIG. 10. In an embodiment, a two feeder system may be provided starting from a source at bus "1", and ending at another source at bus "k". As shown in FIG. 10, the MUs may measure currents, voltages, magnitudes, and angles. Each MU may operate as a PMU referenced to GPS. The GPS communication may be assumed available. This communication may be through the available communication system of distribution substation smart meters, or by using standalone GPS units in each substation.

$$[I_{Feeder}]_{1k}^{NOC} = \begin{bmatrix} I_{12} \\ I_{23} \\ \ldots \\ I_{1(i-1)i} \\ \ldots \\ I_{(k-1)k} \end{bmatrix} \quad (7)$$

$$I_{(i-1)i} = \begin{cases} I_{S1} & i = 1 \\ I_{(i-1)i} - I_{Li} & i = 2:(k-1) \end{cases}$$

Here, $I_{i(i+1)}$ is the current flow between bus i and (i+1), $I_{Li}$ is the current at load i, and $I_{S1}$ is the current supplied from the first source.

According to another embodiment, in a two feeder system, starting from a source at bus "k" and ending at another source at bus "1", a fixed reference direction may be considered as follows:

$$[I_{Feeder}]_{k1}^{NOC} = \begin{bmatrix} I_{12} \\ I_{23} \\ \ldots \\ I_{1(i-1)i} \\ \ldots \\ I_{(k-1)k} \end{bmatrix} \quad (8)$$

$$I_{(i-1)i} = \begin{cases} -I_{S1} & i = k-1 \\ I_{(i+1)(i+1)} - I_{L(i+1)} & i = (k-2):1 \end{cases}$$

During NOC:

$$[I_{Feeder}]_{1k}{}^{NOC} = [I_{Feeder}]_{k1}{}^{NOC} \quad (9)$$

In addition, the feeder impedance between bus i and i+1 may be:

$$Z_{i(i+1)} = \frac{|V_i|^{\angle\theta_i} - |V_{i+1}|^{\angle\theta_{i+1}}}{|I_{i(i+1)}|^{\angle\delta_{i(i+1)}}} = |Z_{i(i+1)}|^{\angle\beta_{i(i+1)}} \quad i = 1:(k-1) \quad (10)$$

According to certain embodiments, a system may be modeled by obtaining impedances of all feeder sections. The system may be run initially as a radial configuration to ensure current flow in each feeder section. Using system impedances, it may be possible to calculate the system current model, which may represent the current in each feeder section as:

$$[I_{Feeder}]_M = \begin{bmatrix} I_{12} \\ I_{23} \\ \dots \\ I_{1(i-1)i} \\ \dots \\ I_{(k-1)k} \end{bmatrix} \quad (11)$$

$$|I_{i(i+1)}|^{\angle\delta_{i(i+1)}} = \frac{|V_i|^{\angle\theta_i} - |V_{i+1}|^{\angle\theta_{i+1}}}{|Z_{i(i+1)}|^{\angle\beta_{i(i+1)}}} \quad i = 1:(k-1) \quad (12)$$

In certain embodiments, during feeder section faults, $[I_{Feeder}]_{jk}{}^{Fault}$ may give correct $I_{i(i+1)}$ at any feeder-section (from bus 1 to fault) before the fault location including the current supplied to the fault (source 1 current). In addition, during feeder section faults, $[I_{Feeder}]_{ki}{}^{Fault}$ may give correct $I_{i(i+1)}$ at any feeder-section (from bus k to fault) before the fault location including the current supplied to the fault (source 2 current). Further, $[I_{Feeder}]_M{}^{Fault}$ may estimate the currents in all locations except the faulty feeder-section due to the change of its impedance due to a fault impedance.

According to an embodiment, faulty feeder section location may be defined using different matrices, including, for example:

$$[\Delta M]_1{}^{Fault} = |[I_{Feeder}]_M{}^{Fault}| - |[I_{Feeder}]_{ik}{}^{Fault}|$$

$$[\Delta M]_2{}^{Fault} = |[I_{Feeder}]_M{}^{Fault}| - |[I_{Feeder}]_{k1}{}^{Fault}|$$

for $[\Delta M]_1$ and $[\Delta M]_2$, if any element $\Delta M_{i1} < \epsilon$, then set $\Delta M_{i1} = 0$ \quad (13)

Here, $[\Delta M]_1$ and $[\Delta M]_2$ are feature matrices, and $\epsilon$ represents the error in calculation between two methods that could be related to the accuracy of the estimated model of the feeder sections.

In certain embodiments, the faulty feeder-section may be defined using a fault location matrix, according to the following:

$$[FL]_{i(i+1)} = [\Delta M]_1{}^{Fault} \cdot [\Delta M]_2{}^{Fault} \neq 0 \quad (14)$$

The final results, according to certain embodiments, may show $FL_{i(i+1)} \neq 0$ at the faulty transmission lines between bus i and i+1, while all other elements of [FL] will be 0.

Figure 11:
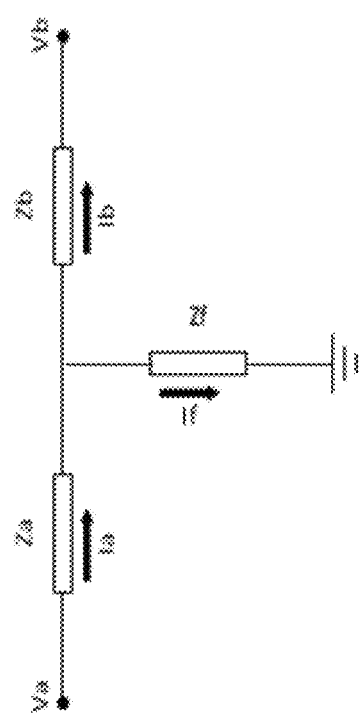
FIG. 11 shows an exemplary faulty feeder system, according to certain embodiments.

Referring to FIG. 11, there is shown an exemplary feeder system, according to certain embodiments. In some embodiments, fault location may be determined. In an embodiment, the exact fault location in the feeder section may be estimated using available measurements. The faulty feeder section and exact fault location, including distance, may be reported to SCADA or directly to the transformer protection device. A model of the feeder section during fault, according to an embodiment, is shown in FIG. 11.

Referring to FIG. 11, the voltage at the bus before and after the faulty line section ($v_a$ and $v_b$) are known from the MUs and the current $I_a$ may be calculated from $[I_{Feeder}]_{jk}{}^{Fault}$ and $i_b$ and $I_b$ may be calculated from $[I_{Feeder}]_{k1}{}^{Fault}$. The total impedance of the faulty line before the fault (Z) may be divided to ($Z_a$ and $Z_b$) during the fault. Thus, the following voltage at the bus before and after the faulty line section may be:

$$V_a = I_a Z_a + I_f Z_f \quad (15)$$
$$V_b = -I_b (Z - Z_a) + I_f Z_f$$
$$\therefore Z_a = \frac{V_a - V_b - I_b Z}{I_f}, Z_f = \frac{V_a - I_a Z_a}{I_f}$$

The distance of fault location from the beginning of the feeder section may be a percentage of $$\left( \left| \frac{Z_a}{Z} \right| \right)$$

from the total length of the line.

According to certain embodiments, various corrective actions may be initiated before and following system faults. In an embodiment, in a system level, before faults occur and under normal operation conditions, it may be possible to provide real-time state estimations of a distribution system. It may also be possible to develop more accurate off-line system models of the distribution network and continuously tune the model data. It may further be possible to enhance voltage profile and system losses, define available and used distribution energy resources, define used and available routes as well as equipment loading to develop more options for reroute power and serve the load, obtain accurate load estimation and load models, perform self-monitoring of different measuring instruments, assess power quality, and synchronize distributed energy resources with the utility network.

In certain embodiments, in a system level, during fault conditions, it may be possible to detect fault on feeder sections based on communicating MU's measurements in the distribution substation, distributed energy resources, and primary substation. It may also be possible to isolate the faulted feeder section, define the exact fault location, and to reroute power and restore service to the disconnected loads.

According to certain embodiments, in the equipment level, it may be possible to anticipate impending fault. This application may be applied on a primary substation and may be implemented on important equipment in the distribution network. The MUs may monitor the grounded current for detecting PD or arc activities before flashover takes place.

In certain embodiments, the following corrective actions may be initiated before equipment faults occur. According to an embodiment, for stable PD features within an allowable limit, continuous monitoring and comparisons with similar equipment under similar operation conditions may be performed. It may also be possible to develop NOC reference features.

According to another embodiment, when there are increasing PD features, it may be possible to monitor the progress in the captured PD signals to define event location and quantify event severity, report features and signals for asset management to the SCADA, use off-line system models to adjust operation conditions, and reroute power to serve the load and disconnect equipment for maintenance.

In certain embodiments, when there are increasing PD features towards an arc, it may be possible to initiate protection action by disconnecting the power. This action may be performed directly by the connecting MU with IED that protect the equipment, or through the SCADA. It may also be possible to process the captured arc signals locally at the MU to classify, define its location, and quantify event severity. It may also be possible to report event features and signals for asset management to the SCADA.

According to certain embodiments, under real-time applications, during faults, IEEE C37.118 synchrophasor measurement data may be the main element in the algorithm described above, and may be reported to the SCADA system at a rate of not less than 10 frames per second. Similarly, during arcs (if not gradually developed after PD activities), the magnitude of the monitored signal may become very large as compared with that of the PD. Thus, protection action may be initiated through the IED or SCADA system.

In certain embodiments, under non-real-time applications, during PD activities, the processing capability of the MU may make it more powerful to develop an event-driven network and report-by-exception whenever the developed sets of SA features exceed a predefined number. In certain embodiments, the predefined number may be from 20 to 32 sets. The processor in the MU may open the communication port and the SCADA as client requests from the MU as the server to send 16 holding register values that represent the Max $(wd_j)_c$ magnitudes and their locations for each triggered signal. This operation may be implemented on all the triggered signals. The MU may then close the communication port with the SCADA to stop requesting new coefficients until the appearance of new SA features with larger magnitudes.

Figure 12:
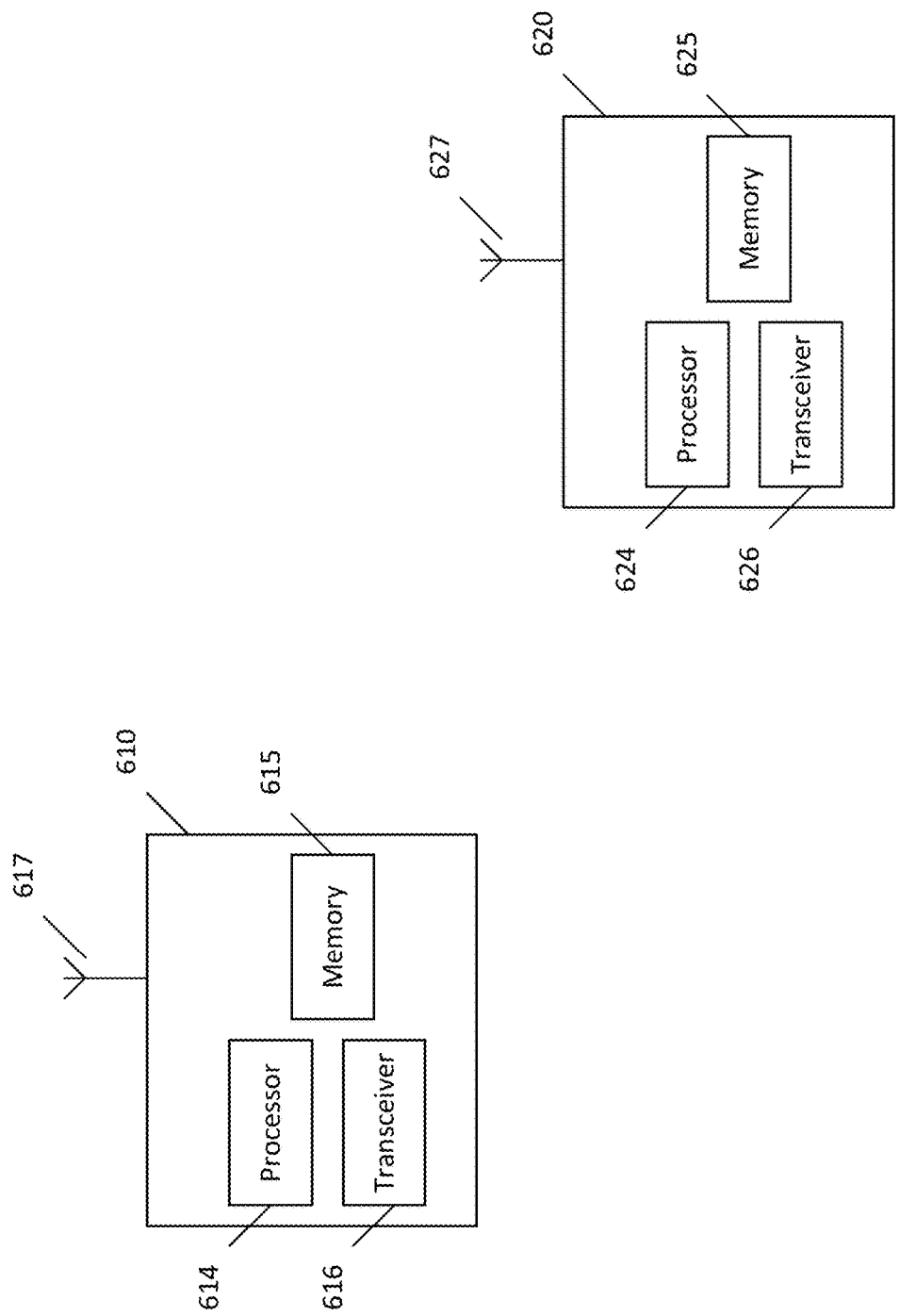
FIG. 12 shows an exemplary system, according to certain embodiments.

Referring to FIG. 12, there is shown an exemplary system, according to certain embodiments. In one embodiment, a system may include multiple devices such as, for example, at least a first apparatus 610 and a second apparatus 620. According to other embodiments, more apparatuses may also be included in the system.

In certain embodiments, apparatus 610 may be any merging unit, such as smart merging unit (MU), smart IEC 61850 merging unit, or the like. In other embodiments, apparatus 620 may be a supervisory control and data acquisition (SCADA) system, or the like.

Each of these devices may include at least one processor, respectively indicated as 614 and 624 for processing information and executing instructions or operation. Processors 614 and 624 may be any type of general or specific purpose processor. While a single processor 614 and 624 is shown for each device in FIG. 12, multiple processors may be utilized in each device according to other embodiments. In fact, processors 614 and 624 may include one or more of general-purpose computers, special purpose computers, microprocessors, central processing units (CPU), digital signal processors (DSPs), field-programmable gate arrays (FPGAs), application-specific integrated circuits (ASICs), and processors based on a multi-core processor architecture, as examples, or other comparable devices.

The processors may be implemented as a single controller, or a plurality of controllers or processors. The processors may also perform functions associated with the operation of the system including, without limitation, precoding of antenna gain/phase parameters, encoding and decoding of individual bits forming a communication message, formatting of information, and overall control of the system.

At least one memory (internal or external) may be provided in each device, and indicated as 615 and 625. The memory may be any of those described above. The memory may include computer program instructions or computer code contained therein. The processors 614 and 624, and memories 615 and 625, or a subset thereof, may be configured to provide means corresponding to the various blocks and processes shown in FIGS. 13-15 described herein.

Memories 615 and 625 may be combined on a single integrated circuit as the processor, or may be separate from the one or more processors. Furthermore, the computer program instructions stored in the memory and which may be processed by the processors may be any suitable form of computer program code, such as those described above.

Figure 13:
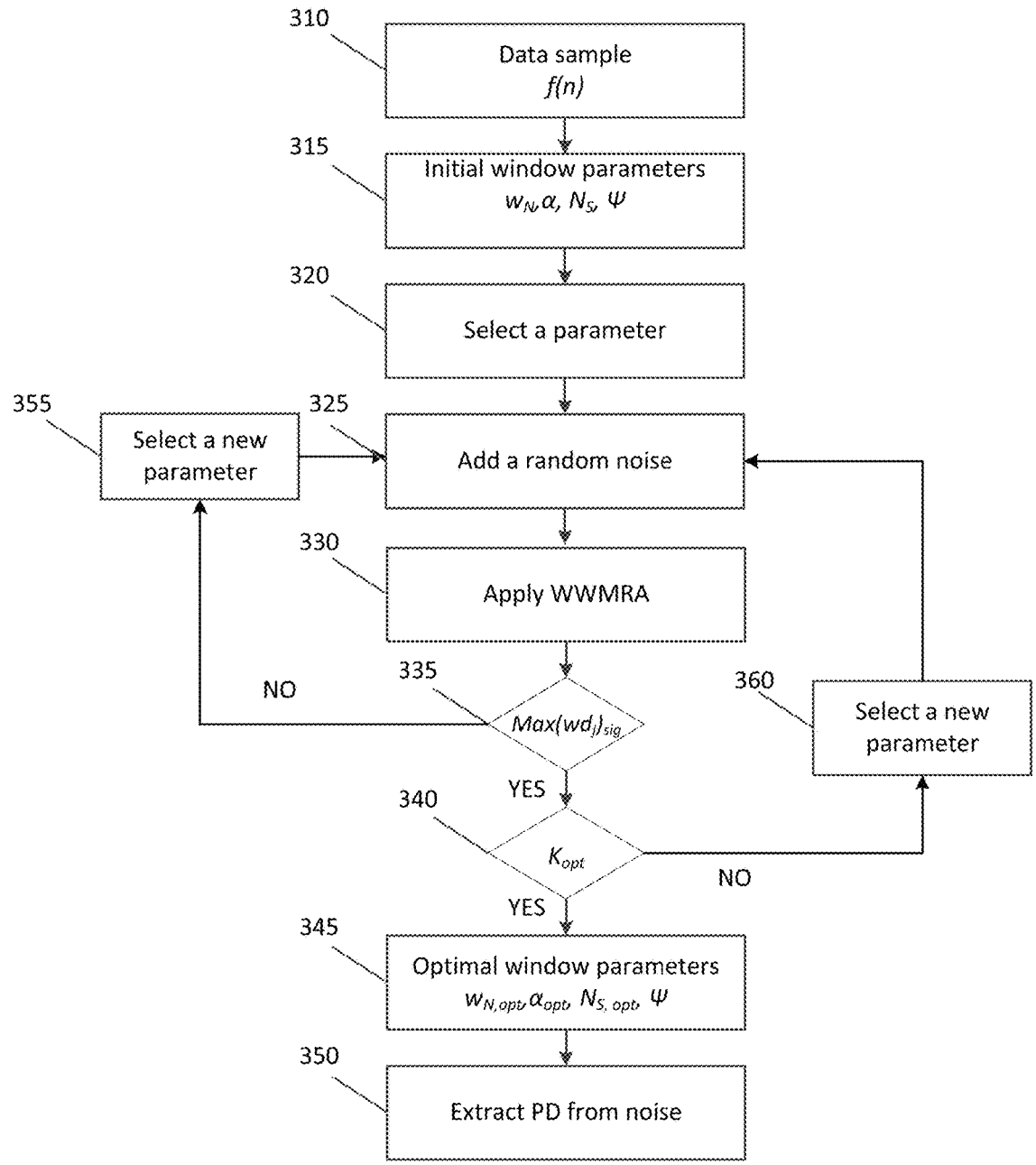
FIG. 13 shows an exemplary flow diagram for monitoring PD and high impedance arcs, according to certain embodiments.
Figure 14:
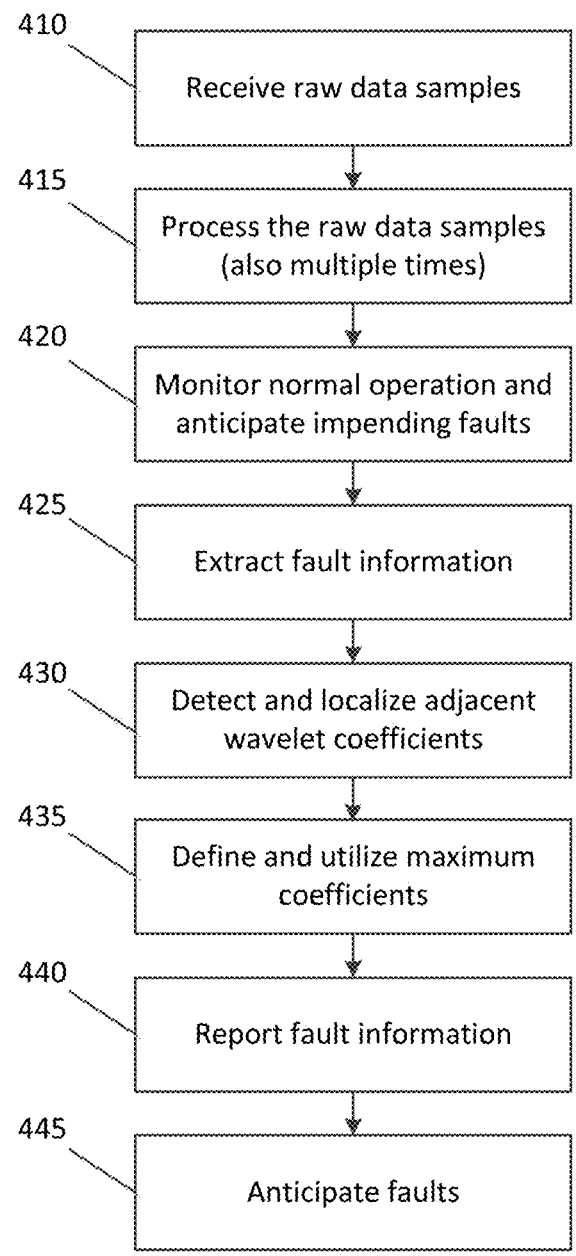
FIG. 14 shows an exemplary flow diagram of a method, according to certain embodiments.
Figure 15:
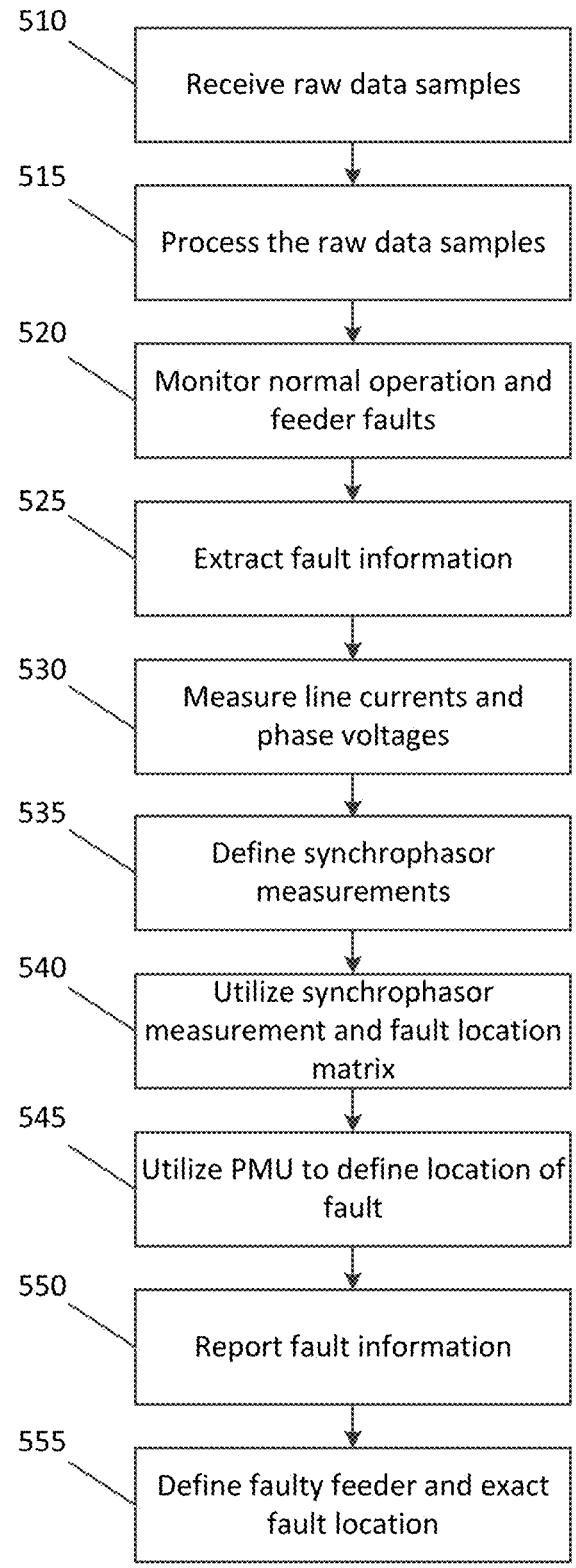
FIG. 15 illustrates another exemplary flow diagram of a method, according to certain embodiments.

The memory and the computer program instructions may be configured, with the processor for the particular device, to cause a hardware apparatus such as the first apparatus 610 and second apparatus 620 to perform any of the processes described herein (see, for example, FIGS. 13-15). Therefore, in certain embodiments, a non-transitory computer-readable medium may be encoded with computer instructions that, when executed in hardware, perform a process such as one of the processes described herein. Alternatively, certain embodiments may be performed entirely in hardware.

As shown in FIG. 12, transceivers 616 and 626 may be provided, and each device may also include an antenna, respectively illustrated as 617 and 627. Other configurations of these devices, for example, may be provided as well. Transceivers 616 and 626 may each, independently, be a transmitter, a receiver, or both a transmitter and a receiver, or a unit or device that is configured both for transmission and reception. In certain embodiments, transceivers 616 and 626 may be capable of transmitting and receiving signals or data directly.

Although FIG. 12 illustrates a system including a first apparatus 610 and a second apparatus 620, other embodiments may be applicable to other configurations, and configurations involving additional elements. For example, although not shown, additional MUs and SCADA systems, or other similar devices and/or components may be present.

As mentioned above, according to one embodiment, the system shown in FIG. 12 may include a first apparatus 610 and a second apparatus 620. In an embodiment, the first apparatus 610 may be controlled by memory 615 and processor 614 to receive raw data samples of a current in a grounding conductor. The first apparatus 610 may also be controlled by memory 615 and processor 614 to process the raw data samples under at least one of a plurality of operating modes. The first apparatus 610 may further be controlled by memory 615 and processor 614 to monitor normal operation and impending faults while operating under at least one of the operating modes. In an embodiment, the plurality of operating modes may include a real-time sampling mode, and an estimated time sampling mode. The first apparatus 610 may also be controlled by memory 615 and processor 614 to extract fault information based on the monitoring. The first apparatus 610 may further be controlled by memory 615 and processor 614 to report the fault information to a supervisory control and data acquisition system human-machine interface. The first apparatus 610 may also be controlled by memory 615 and processor 614 to anticipate faults based on an analysis of the fault information.

In an embodiment, the first apparatus 610 may be controlled by memory 615 and processor 614 to process the raw data samples multiple times with a wavelet-based windowing technique. In another embodiment, the first apparatus 610 may be controlled by memory 615 and processor 614 to select the real-time sampling mode or the estimated time sampling mode based on connected measuring instruments and expected details to be extracted from a processed signal. According to another embodiment, the first apparatus 610 may be controlled by memory 615 and processor 614 to detect and localize a plurality of adjacent wavelet coefficients at a plurality of resolution levels. According to an embodiment, the first apparatus 610 may also be controlled by memory 615 and processor 614 to define a maximum number of adjacent wavelet coefficients detected and localized at each resolution level. According to another embodiment, the first apparatus 610 may be controlled by memory 615 and processor 614 to utilize the maximum coefficients detected and localized at each resolution level to reconstruct the fault information for diagnostic and analysis.

According to one embodiment, the first apparatus 610 may further be controlled by memory 615 and processor 614 to processes raw data samples of feeder currents and bus voltages, including, for example, at 50 Hz or 60 Hz, at primary substations outgoing feeders and at low voltage sides of substation distribution transformers. In an embodiment, the first apparatus 610 may further be controlled by memory 615 and processor 614 to measure the magnitude of line currents and phase voltages, and defining phase shift angles of the line currents and phase voltages with reference to a global positioning system of distribution substation smart meters. In another embodiment, the first apparatus 610 may further be controlled by memory 615 and processor 614 to define synchrophasor measurements with reference to the global positioning system at both primary substation outgoing feeders and distribution substation low voltage sides. In a further embodiment, the first apparatus 610 may further be controlled by memory 615 and processor 614 to utilize phasor measuring units and a fault location matrix to define faulty feeder section locations. In an embodiment, the first apparatus 610 may further be controlled by memory 615 and processor 614 to utilize the phasor measuring units to define the location of the fault in a feeder section.

FIG. 13 illustrates an exemplary flow diagram of a method for monitoring PD and high impedance arcs, according to certain embodiments. The method may include, at 310, inputting data samples of signals. The method may also include, at 315, selecting initial values of Kaiser's window shape ($\alpha$), window size ($w_N$), sliding rate ($N_s$), and selected mother wavelet ($\psi$). The method may further include, at 320, selecting and varying a parameter window shape ($\alpha$), starting from a small value. In an embodiment, the small value may be $\alpha=5$, and the other parameters may be fixed. The method may also include, at 325, applying a random noise to the signal. The method may further include, at 330, applying a windowing wavelet multi-resolution analysis (WWMRA). The method may also include, at 335, monitoring and defining the maximum number of adjacent wavelet $Max(wd_j)_{sig}$. If the maximum number of adjacent wavelet $Max(wd_j)_{opt}$ is unable to be defined, the method may include, at 355, selecting a new parameter, such as a while processing signal with noise for different processing cycles until a set of $Max(wd_j)_{sig}$ is extracted and localized at the same window center $w_c$ at a large number of adjacent resolution levels.

The method may further include, at 340, defining optimal processing window parameters $K_{opt}$. If the optimal processing window parameters are unable to be defined, the method may include, at 360, selecting a new parameter, such as a as a fixed value when the maximum number of adjacent wavelet $Max(wd_j)_{opt}$ is satisfied. The method may also include, at 360, varying sequentially, other parameters while processing the signal with noise for different processing cycles until a set of $Max(wd_j)_{sig}$ is extracted and localized at the same window center $w_c$ at a large or larger number of adjacent resolution levels. The method may further include, at 345, defining optimal window parameters for a selected mother wavelet ($\psi$). The method may also include, at 350, using these parameters to construct Kaiser's window to be used with the wavelet multi-resolution analysis for developing SA features to anticipate impending faults or extracting partial discharge signals impeded in high noise.

In certain embodiments, the selection of the window parameters may depend on the size and shape of the event to be detected. In some cases, the event may have an impulsive nature, and in others, it may be oscillatory. In other cases, the event size may represent about 2% to about 5% of the processing data, and in other cases it may represent more than about 30% of the processed data. Further, selecting a small sliding rate if the signal details are essential, and using larger sliding rates if a signal's pattern is essential.

According to certain embodiments, a small window shape ($\alpha$) may be selected with a window size ($w_N$) larger than the event to be extracted. Then these parameters and the sliding rate ($N_s$) may be adjusted until a set of $Max(wd_j)_{opt}$ is obtained and localized at the same window center $w_c$ at a large number of the adjacent resolution levels. These parameters may be further adjusted to extract more details of the event. The mother wavelet ($\psi$) may generally be selected to be similar to the event to be extracted. The modified Kaiser window may increase the similarity between the signal under processing and the selected mother wavelet.

FIG. 14 illustrates another exemplary flow diagram of a method, according to certain embodiments. In certain embodiments, the method of FIG. 15 may be performed by the first apparatus 610. In certain embodiments, the first apparatus 610 may be any MU, such as a smart MU, smart IEC 61850 MU, or the like. In other embodiments, the method may be for impending fault detection in primary substation transformers, and faults in feeders connecting primary substations with distribution substations in ring systems.

The method may include, at 410, receiving raw data samples of a current in a grounding conductor. The method may also include, at 415, processing raw data samples under at least one of a plurality of operating modes. In an embodiment, the processing may include processing the raw data samples multiple times with a wavelet-based windowing technique. In another embodiment, the plurality of operating modes may include a real-time sampling mode, and an estimated time sampling mode. In yet another embodiment, the real-time sampling mode or estimated time sampling mode may be selected based on connected measuring instruments and expected details to be extracted from the processed signal. The method may further include, at 420, monitoring normal operation and impending faults while operating under at least one of the operating modes.

The method may further include, at 425, extracting fault information based on the monitoring. The method may also include, at 430, detecting and localizing a plurality of adjacent wavelet coefficients at a plurality of resolution levels. The method may also include, at 435, defining and utilizing the maximum coefficients detected and localized at each resolution level to reconstruct the fault information for diagnostic and analysis. The method may further include, at 440, reporting the fault information to a supervisory control and data acquisition system human-machine interface. The method may also include, at 445, anticipating faults based on an analysis of the fault information.

In other embodiments, the processing may include processing the raw data samples multiple times with a wavelet-based windowing technique. In an embodiment, the operating modes may include a real-time sampling mode and an estimated time sampling mode. According to other embodiments, the method may include detecting and localizing a plurality of adjacent wavelet coefficients at a plurality of resolution levels, and defining a maximum number of adjacent wavelet coefficients detected and localized at each resolution level.

FIG. 15 illustrates an exemplary flow diagram of a method, according to certain embodiments. In certain embodiments, the method of FIG. 15 may be performed by the first apparatus 610. In certain embodiments, the first apparatus 610 may be any MU, such as a smart MU, smart IEC 61850 MU, or the like. In other embodiments, the method may be for fault detection in substation feeders.

The method may include, at 510, receiving raw data samples of a current in line conductors. The method may also include, at 515, processing raw data samples under at least one of a plurality of operating modes. In an embodiment, the processing may include processing raw data samples of feeder currents and bus voltages, including for example, at 50 Hz or 60 Hz, at primary substations outgoing feeders and at low voltage sides of substation distribution transformers. In another embodiment, the operating mode may include a real-time sampling mode. The method may further include, at 520, monitoring normal operation and feeder faults while operating under at least one of the operating modes. The method may further include, at 525, extracting fault information based on the monitoring. The method may also include, at 530, measuring the magnitude of line currents and phase voltages, and defining phase shift angles of the line currents and phase voltages with reference to a global positioning system of distribution substation smart meters. The method may further include, at 535 defining synchrophasor measurements with reference to the global positioning system at both primary substation outgoing feeders and distribution substation low voltage sides. The method may also include, at 540, utilizing phasor measuring units and a fault location matrix to define faulty feeder section locations. The method may also include, at 545, utilizing the phasor measuring units to define the location of the fault in a feeder section. The method may further include, at 550, reporting the fault information to a supervisory control and data acquisition system human-machine interface. The method may also include, at 555, defining faulty feeders and exact fault locations based on an analysis of the fault information. According to an embodiment, measuring line currents and phase voltages at 530 and defining synchrophasor measurements at 535 occur after processing the raw data samples at 515.

Although the foregoing description is directed to the preferred embodiments of the invention, it is noted that other variation and modifications will be apparent to those skilled in the art, and may be made without departing from the spirit or scope of the invention. Moreover, features described in connection with one embodiment of the invention may be used in conjunction with other embodiments, even if not explicitly stated above.

We claim:

1. A method for impending fault detection in primary substation transformers, comprising:
   receiving raw data samples of currents in grounding conductors;
   processing the raw data samples under at least one of a plurality of system operating modes;
   monitoring normal operation;
   anticipating an impending fault or detecting faults while operating under at least one of the system operating modes;
   extracting impending fault information based on the monitoring;
   reporting the impending fault information to a supervisory control and data acquisition system human-machine interface; and
   anticipating faults based on an analysis of the raw data samples.

2. The method according to claim 1, further comprising processing the raw data samples multiple times with a wavelet-based windowing technique.

3. The method according to claim 1, wherein the system operating modes comprise a real-time sampling mode and an estimated time sampling mode.

4. The method according to claim 3, further comprising selecting the real-time sampling mode or the estimated time sampling mode based on connected measuring instructions and expected details to be extracted from a processed signal.

5. The method according to claim 1, further comprising detecting and localizing a plurality of adjacent wavelet coefficients at a plurality of resolution levels.

6. The method according to claim 5, further comprising defining a maximum number of adjacent wavelet coefficients detected and localized at each resolution level.

7. The method according to claim 6, further comprising utilizing the maximum coefficients detected and localized at each resolution level to reconstruct the impending fault information for diagnostic and analysis.

8. An apparatus for impending fault detection in primary substation transformers, comprising:
   at least one processor; and
   at least one memory including computer program code,
   wherein the at least one memory and the computer program code are configured, with the at least one processor, to cause the apparatus at least to
   receive raw data samples of currents in grounding conductors;
   process the raw data samples under at least one of a plurality of system operating modes;
   monitor normal operation;
   anticipate an impending fault or detect faults while operating under at least one of the system operating modes;
   extract impending fault information based on the monitoring;
   report the impending fault information to a supervisory control and data acquisition system human-machine interface; and
   anticipate faults based on an analysis of the raw data samples.

9. The apparatus according to claim 8, wherein the at least one memory and the computer program code are configured, with the at least one processor, to cause the apparatus at least to process the raw data samples multiple times with a wavelet-based windowing technique.

10. The apparatus according to claim 8, wherein the system operating modes comprise a real-time sampling mode and an estimated time sampling mode based on the connected measuring instruments and expected details to be extracted.

11. The apparatus according to claim 8, wherein the at least one memory and the computer program code are configured, with the at least one processor, to cause the apparatus at least to detect and localize a plurality of adjacent wavelet coefficients at a plurality of resolution levels.

12. The apparatus according to claim 11, wherein the at least one memory and the computer program code are configured, with the at least one processor, to cause the apparatus at least to define a maximum number of adjacent wavelet coefficients detected and localized at each resolution level.

13. The apparatus according to claim 12, wherein the at least one memory and the computer program code are configured, with the at least one processor, to cause the apparatus at least to utilize the maximum coefficients detected and localized at each resolution level to reconstruct the impending fault information for diagnostic and analysis.

14. A computer program, embodied on a non-transitory computer readable medium, the computer program, when executed by a processor, causes the processor to:
receive raw data samples of currents in grounding conductors;
process the raw data samples collected under at least one of a two system operating modes;
monitor normal operation;
anticipate an impending fault or detect faults while operating under at least one of the system operating modes;
extract impending fault information based on the monitoring;
report the impending fault information to a supervisory control and data acquisition system human-machine interface; and
anticipate faults based on an analysis of the raw data samples.

15. The computer program according to claim 14, wherein the computer program, when executed by the processor, further causes the processor to process the raw data samples multiple times with a wavelet-based windowing technique.

16. The computer program according to claim 14, wherein the operating modes comprise a real-time sampling mode and an estimated time sampling mode.

17. The computer program according to claim 14, wherein the computer program, when executed by the processor, further causes the processor to detect and localizing a plurality of adjacent wavelet coefficients at a plurality of resolution levels.

18. The method according to claim 17, wherein the computer program, when executed by the processor, further causes the processor to define a maximum number of adjacent wavelet coefficients detected and localized at each resolution level.

19. The method according to claim 18, wherein the computer program, when executed by the processor, further causes the processor to utilize the maximum coefficients detected and localized at each resolution level to reconstruct the impending fault information for diagnostic and analysis.

* * * * *